United States Patent
Chen et al.

(10) Patent No.: US 8,149,610 B2
(45) Date of Patent: Apr. 3, 2012

(54) NONVOLATILE MEMORY DEVICE

(75) Inventors: Yi-Chou Chen, Hsinchu (TW);
Wei-Chih Chien, Sijhih (TW);
Feng-Ming Lee, Changhua (TW)

(73) Assignee: Macronix International Co., Ltd. (TW)

( * ) Notice: Subject to any disclaimer, the term of this patent is extended or adjusted under 35 U.S.C. 154(b) by 196 days.

(21) Appl. No.: 12/778,533

(22) Filed: May 12, 2010

(65) Prior Publication Data

US 2011/0280058 A1    Nov. 17, 2011

(51) Int. Cl.
*G11C 11/00*    (2006.01)

(52) U.S. Cl. ............... 365/148; 365/185.03; 365/189.15

(58) Field of Classification Search ............... 365/148, 365/185.03, 189.15
See application file for complete search history.

(56) References Cited

U.S. PATENT DOCUMENTS

| | | |
|---|---|---|
| 6,996,009 B2 | 2/2006 | Forbes |
| 7,307,868 B2 | 12/2007 | Symanczyk |
| 7,327,603 B2 | 2/2008 | Roehr |
| 7,372,065 B2 | 5/2008 | Kozicki |
| 7,542,326 B2 * | 6/2009 | Yoshimura et al. ........... 365/148 |
| 7,560,762 B2 | 7/2009 | Shih |
| 7,719,873 B2 * | 5/2010 | Hachino et al. ............... 365/148 |
| 8,059,448 B2 * | 11/2011 | Tanigami et al. ............. 365/148 |
| 2006/0279983 A1 * | 12/2006 | Hachino et al. ............... 365/158 |
| 2007/0103963 A1 | 5/2007 | Kim |
| 2008/0049487 A1 * | 2/2008 | Yoshimura et al. ........... 365/148 |
| 2008/0089111 A1 | 4/2008 | Lee |
| 2009/0020740 A1 | 1/2009 | Chien |
| 2009/0021404 A1 | 1/2009 | Satoh |
| 2009/0161408 A1 * | 6/2009 | Tanigami et al. ............. 365/148 |
| 2009/0168495 A1 | 7/2009 | Aoki |
| 2009/0175079 A1 | 7/2009 | Wang |
| 2009/0212274 A1 | 8/2009 | Breitwisch |
| 2009/0236581 A1 | 9/2009 | Yoshida |
| 2011/0199812 A1 * | 8/2011 | Kitagawa et al. ............. 365/148 |

OTHER PUBLICATIONS

Tanaka, et al. "Bit Cost Scalable Technology with Punch and Plug Process for Ultra High Density Flash Memory" 2007 Symposium on VLSI Technology Digest of Technical Papers.
Shimojo, et al. "High-Density and High-Speed 128Mb Chain FeRAM with SDRAM-Compatible DDR2 Interface" 2009 Symposium on VLSI Technology Digest of Technical Papers.

* cited by examiner

*Primary Examiner* — Tuan T. Nguyen
(74) *Attorney, Agent, or Firm* — Baker & McKenzie LLP

(57) ABSTRACT

A memory device comprises an array of memory cells each capable of storing multiple bits of data. Each memory cell includes a programmable transistor in series with a resistance switching device. The transistor is switchable between a plurality of different threshold voltages associated with respective memory states. The resistance switching device is configured to be switchable between a plurality of different resistances associated with respective memory states.

33 Claims, 19 Drawing Sheets

NONVOLATILE MEMORY DEVICE

BACKGROUND

1. Technical Field

The present invention relates to electronic memory devices, and more particularly, to semiconductor memory devices suitable for use as a nonvolatile memory devices.

2. Related Art

Electronic memory devices are well known and commonly found in a variety of electronic systems. For example, electronic memory devices (sometimes referred to as computer memory) can be found in computers and other computing devices. Various removable or stand-alone electronic memory devices are also known, such as memory cards or solid-state data storage systems. For example, it is known to use a removable memory card for storing pictures on a digital camera or for storing movies recorded with a digital video recorder.

Most electronic memory devices can be classified as either volatile or nonvolatile. A volatile electronic memory device is, in general, one which requires power in order to maintain the stored information. An example of a volatile electronic memory device is a Static Random Access Memory (SRAM) or Dynamic Random Access Memory (DRAM) computer memory device, which only retains the stored data while the computer is on, and which loses the stored data when the computer is turned off or otherwise loses power. In contrast, a nonvolatile electronic memory device is, in general, one which is capable of retaining stored data in the absence of an external power source. An example of a nonvolatile memory is a memory card such as those commonly used with digital cameras. Such a memory card can record a picture taken with the camera, and can retain the picture data even while the memory card is removed from the camera.

As the systems that use electronic memory devices become more powerful, the demand for data storage capacity increases as well. For example, more powerful computers and software generally operate better with increased amounts of random access memory (RAM); higher resolution cameras create larger picture and movie files that are better accommodated by memory cards having larger storage capacity. Thus, a trend in the electronic memory device industry has been to find ways of increasing the data storage capacity of memory devices. However, it is not sufficient to simply increase capacity—it is often equally desirable to maintain, or even reduce, the size of a memory device while increasing the data storage capacity. Thus, another trend has been towards increasing the amount of data storage for a given size, in other words towards greater bit density. Still another consideration is cost. For example, it is desirable to maintain or reduce the cost of an electronic memory device as the bit density increases. In other words, it is desirable to reduce the bit cost (cost per bit) of electronic memory devices. Still further considerations are performance related, such as providing faster storage of data and faster access to data stored on an electronic memory device.

One approach to providing increased bit density has been to reduce the size of individual memory cells. For example, as manufacturing processes are improved, smaller structures can be formed, thereby allowing for the manufacture of smaller memory cells. However, some projections indicate that bit cost will begin to increase using this approach in the future, because at some point the process cost will likely begin to increase more rapidly than the memory-cell-reduction rate. Thus, it is desirable to find alternative approaches for increasing the bit density of electronic memory devices.

SUMMARY

Memory devices and methods associated with memory devices are described herein. According to one aspect of the present disclosure, a memory device can comprise an array of memory cells, where each memory cell respectively comprises a transistor and a resistance switching device connected in series with the transistor. The transistor and the resistance switching device can each be capable of independently storing one or more bits of data. The transistor can comprise a first terminal, a second terminal, and a gate terminal, and the transistor can be configured to be switchable between a plurality of different threshold voltages associated with respective memory states. The resistance switching device can be connected in series with one of the first and second terminals of the transistor. The resistance switching device can be configured to be switchable between a plurality of different resistance values that are associated with respective memory states. The resistance switching device can comprise a first memory layer, a second memory layer, and a medium layer formed between the first memory layer and the second memory layer.

According to another aspect of the present disclosure, a memory device can comprise a first control line, a second control line, and a memory cell in communication with the first and second control lines. The memory cell can comprise a transistor and a resistance switching device connected in series with the transistor. The transistor and the resistance switching device can each be capable of independently storing one or more bits of data. The transistor can comprise a first terminal, a second terminal, and a gate terminal. The transistor can be configured to be switchable between a plurality of different threshold voltages associated with respective memory states. The resistance switching device can be connected in series between the first control line and the first terminal of the transistor. The resistance switching device can be configured to be switchable between a plurality of different resistances associated with respective memory states. The resistance switching device can comprise a first memory layer, a second memory layer, and a medium layer formed between the first memory layer and the second memory layer.

According to still further aspects of the present disclosure, methods of reading and writing to a memory cell are provided for reading and writing to a memory cell that comprises a transistor and a resistance switching device connected in series with the transistor, where the transistor and the resistance switching device are each capable of independently storing one or more bits of data. For example, according to one aspect of the present disclosure, a reading method can comprise detecting a threshold voltage of a transistor of a memory cell, where the transistor is configured to be switchable between a plurality of threshold voltages associated with respective memory states. The reading method can also comprise detecting a resistance of a resistance switching device of the memory cell, where the resistance switching device is connected in series with the transistor and the resistance switching device is configured to be switchable between a plurality of resistances associated with respective memory states. The resistance switching device can comprise a first memory layer, a second memory layer, and a medium layer formed between the first memory layer and the second memory layer. These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

Figure 1:
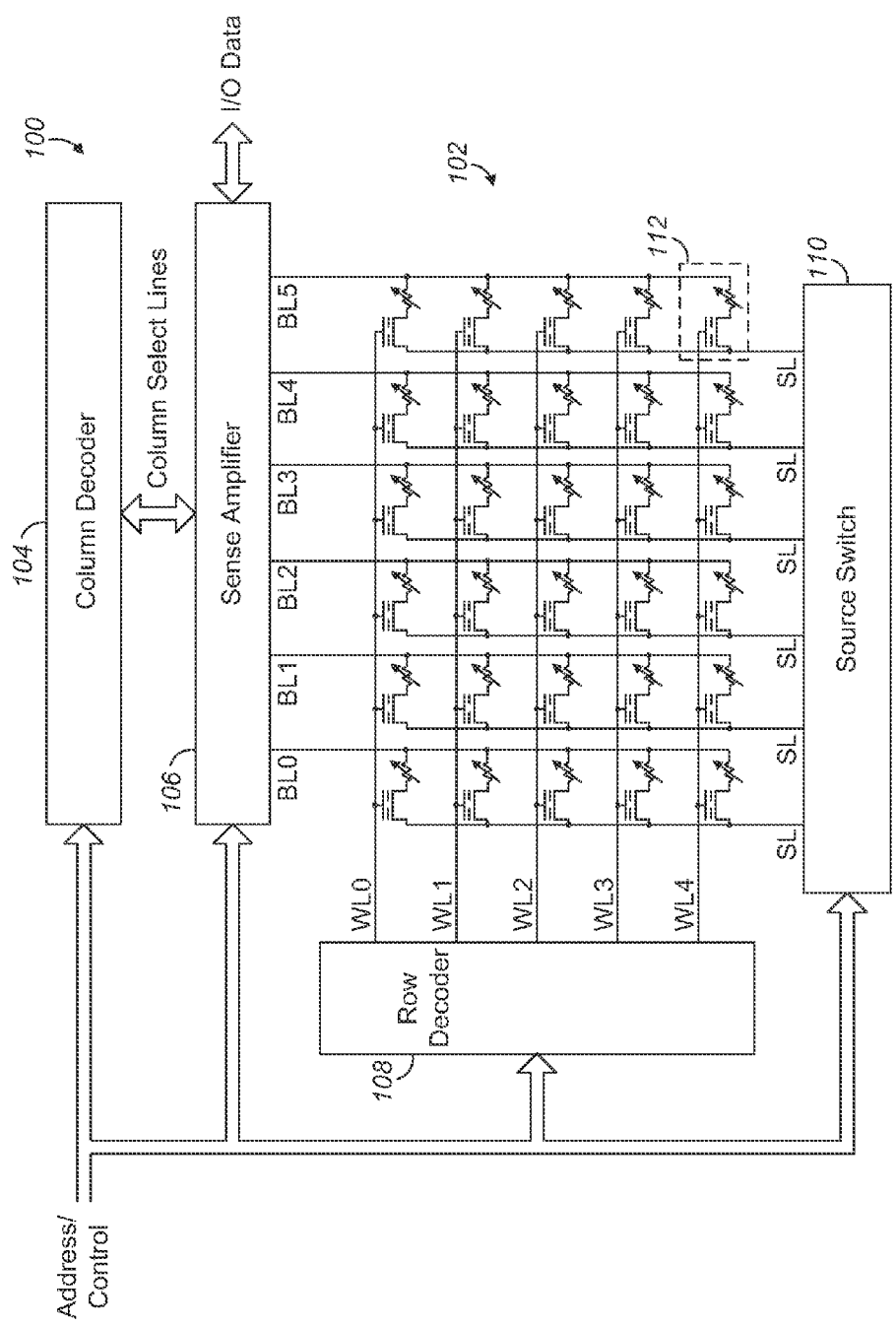
FIG. 1 shows a block diagram of a memory device in accordance with an embodiment of the present disclosure.

FIG. 1 shows a block diagram of a memory device 100 in accordance with an embodiment of the present disclosure. The memory device 100 can include a memory array 102, a column decoder 104, a sense amplifier 106, a row decoder 108, and a source switch 110. The memory array 102 can include a plurality of memory cells 112.

The memory device 100 can be configured such that the memory cells 112 are arranged in a manner similar to a NOR flash memory architecture with word lines WL0-WL4, bit lines BL0-BL5, and source lines SL arranged into rows and columns. The bit lines BL0-BL5 of the memory array 102 can be connected to the sense amplifier 106. The word lines WL0-WL5 can be connected to the row decoder 108. The source lines SL can be connected to the source switch 110. Address and control signals can be input on address/control lines into the memory device 100 and connected to the column decoder 104, sense amplifier 106, row decoder 108, and source switch 110 and can be used to gain read and write access, among other things, to the memory array 102.

The column decoder 104 can be connected to the sense amplifier 106 via control and column select signals on column select lines. The sense amplifier 106 can be configured to receive input data destined for the memory array 102 and output data read from the memory array 102 over input/output (I/O) data lines.

Figure 2:
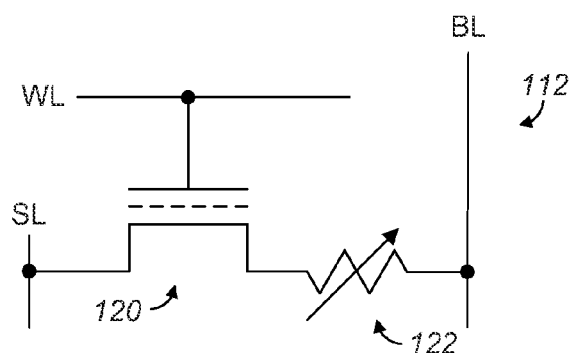
FIG. 2 shows a schematic diagram of a memory cell according to an embodiment of the present disclosure.

FIG. 2 shows a schematic diagram of a memory cell 112 according to an embodiment of the present disclosure. The memory cell 112 includes a transistor 120 and resistance switching device 122.

The transistor 120 can be configured such that the gate is connected to a word line WLn, the drain is connected to the resistance switching device 122, and the source is connected to a source line SL. The transistor 120 can be a floating gate transistor, n-type transistor, p-type transistor or Fin-FET configured such that the threshold voltage Vt of the transistor 120 is changeable between two or more values, where certain values of Vt are associated with respective memory states. For example, the transistor 120 can be a single-level cell (SLC) floating gate transistor, a multi-level cell (MLC) floating gate transistor, a nano-crystal flash transistor, or a nitride trap device.

Thus, the transistor 120 can be configured to store plural Vt states in one or plural locations. In some embodiments, for example, the transistor 120 can be configured to be a 1-bit memory device capable of being programmed to either one of two distinct threshold voltages Vt. Such embodiments can include embodiments where the transistor 120 is an SLC floating gate transistor. In some embodiments, for example, the transistor 120 can be configured to be a 2-bit memory device capable of being programmed to any one of four distinct threshold voltages Vt. Such embodiments can include embodiments where the transistor 120 is an MLC floating gate transistor. Embodiments of the transistor 120 that include a floating gate device can be programmed by hot electron injection and erased by Fowler-Nordheim (FN) electron tunneling.

The resistance switching device 122 can be connected between a bit line BLn and the drain of the transistor 120. The resistance switching device 122 can be configured such that the resistance of the resistance switching device 122 is changeable between multiple resistance values, where certain resistance values are associated with respective memory states. For example, the resistance switching device 122 can be a resistance type memory device as described in U.S. Pat. No. 7,524,722 to Lee et al., which is hereby incorporated by reference.

Thus, in some embodiments, the memory cell 112 can be configured to store one or more bits. For example, in some embodiments, the transistor 120 can be configured to be switched between two memory states and the resistance switching device 122 can be configured to be switched between two memory states so that the memory cell 112 is a two-bit memory device capable of a total of four memory states.

Figure 33:
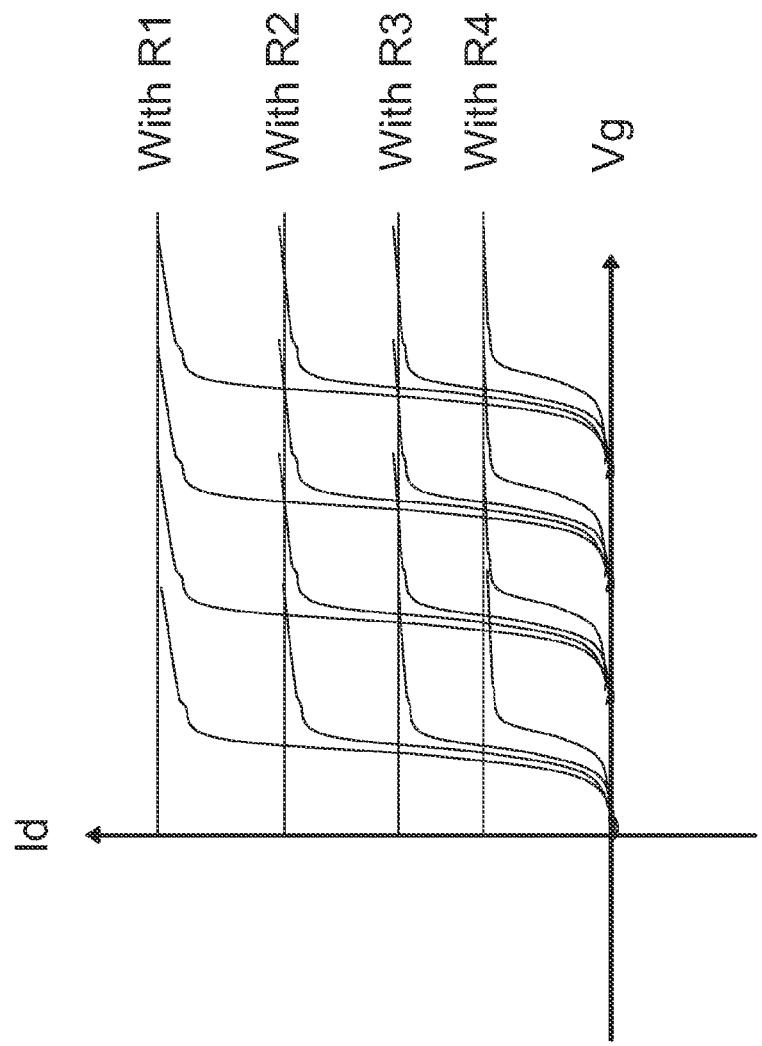
FIG. 33 shows an I-V diagram of an embodiment of the memory cell shown in FIG. 2.

FIG. 33 shows an I-V curve of an embodiment where the transistor 120 can be configured to be switched between 4 (2^2) memory states associated with respective threshold voltages $V_{t1}$-$V_{t4}$. The resistance switching device 122 can be configured to be switched between 4 (2^2) memory states associated with respective resistance values R1-R4. Thus, the transistor 120 is capable of storing two bits of data and the resistance switching device 122 is capable of storing two bits of data. Together, the transistor 120 and resistance switching device 122 of this embodiment provide for a memory cell 112 that is capable of a total of 2^(2+2)=16 memory states, thereby providing for a 4-bit memory cell 112.

Figure 34:
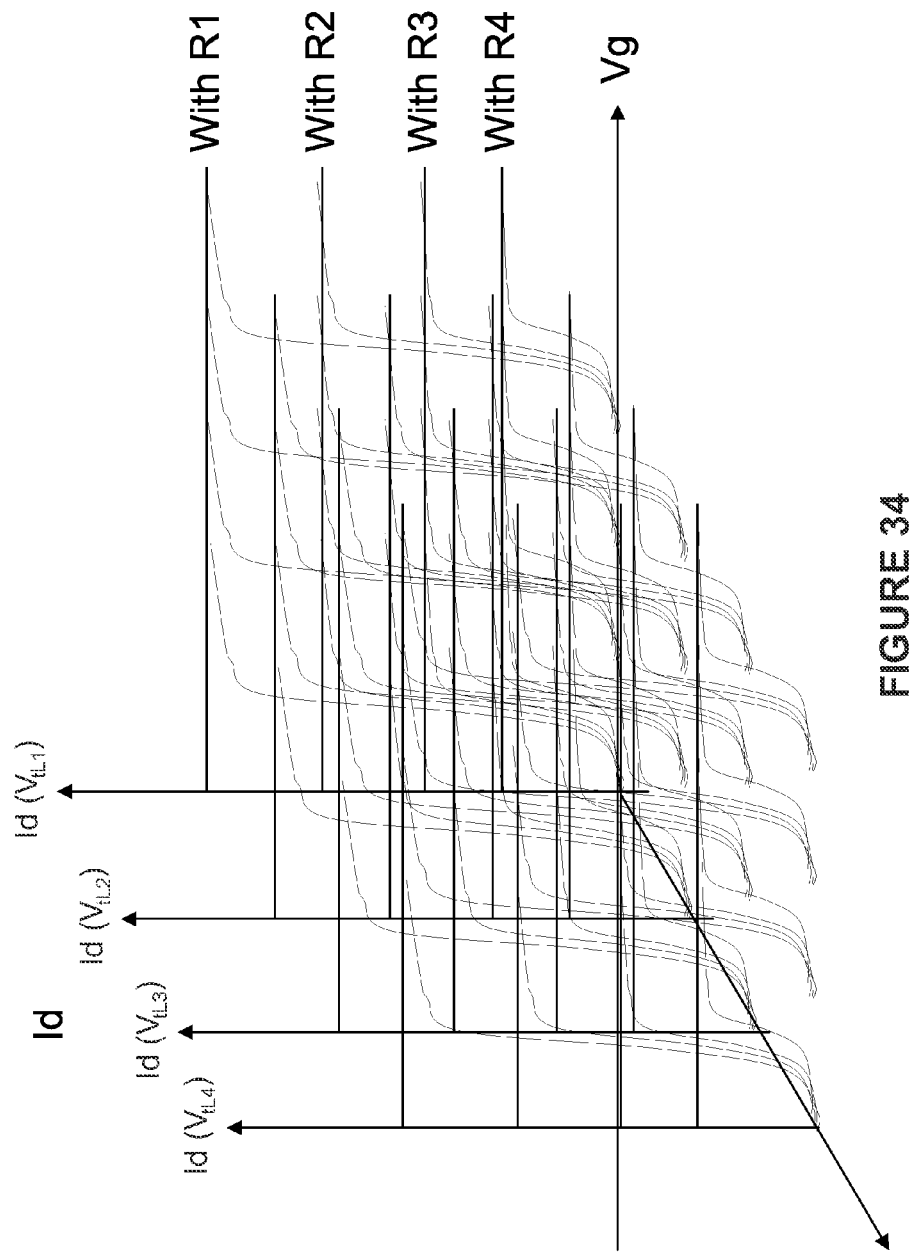
FIG. 34 shows an I-V diagram of another embodiment of the memory cell shown in FIG. 2.

FIG. 34 shows an I-V curve of an embodiment where the transistor 120 can be a multi-level cell that is configured to be switched between 16 (2^4) memory states associated with respective threshold voltages. The threshold voltages include four threshold voltages per level ($V_{tL1}$-$V_{tL4}$). The resistance switching device 122 can be configured to be switched between 4 (2^2) memory states associated with respective resistance values R1-R4. Thus, the transistor 120 is capable of storing four bits of data and the resistance switching device 122 is capable of storing two bits of data. Together, the transistor 120 and resistance switching device 122 of this embodiment provide for a memory cell 112 that is capable of a total of 2^(4+2)=64 memory states, thereby providing for a 6-bit memory cell 112. Alternatively, the resistance switching device 122 can be configured to be switched between 8 (2^3) memory states. In such embodiments, the transistor 120 and the resistance switching device 122 provide for a memory cell 112 that is capable of a total of 2^(4+3)=128 memory states, thereby providing for a 7-bit memory cell 112.

Still further embodiments can include a transistor 120 configured to be switched between a selected number N1 threshold voltages associated with respective memory states, and the resistance switching device 122 is configured to be switched between a selected number N2 resistances associated with respective memory states, so that the memory cell 112 is therefore configured to have a total of N1+N2 memory states.

Figure 3A:
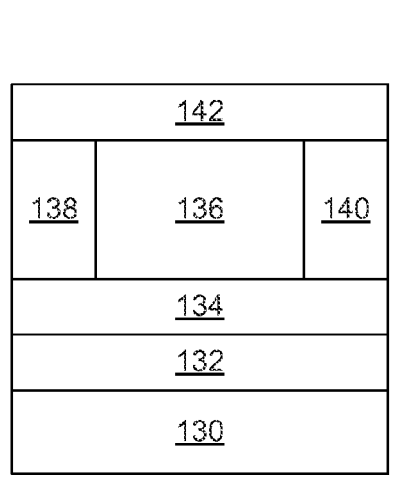
FIGS. 3A and 3B show schematic views of a resistance switching device according to some embodiments of the resistance switching device shown in FIG. 2.

FIG. 3A shows a schematic view of a resistance switching device 122a according to some embodiments of the resistance switching device 122. The resistance switching device 122a includes a substrate 130, an intermetal dielectric (IMD) layer 132, a first electrode layer 134, a tungsten oxide layer 136, first and second dielectric layers 138 and 140, and a second electrode layer 142.

The substrate 130 can be a silicon substrate, and the intermetal dielectric layer 132 can be an oxide layer or other electrically-insulating layer formed on the substrate 130 by known methods, for example by chemical vapor deposition (CVD).

The first electrode 134 can be formed of titanium nitride (TiN) and disposed on the IMD layer 132 by a CVD or physical vapor deposition (PVD) process. Alternatively, the material of the first electrode 134 can include doped polysilicon, aluminum, copper, or tantalum nitride (TaN).

The tungsten oxide layer 136 is formed over the first electrode 134. The first and second dielectric layers 138 and 140 flank the tungsten oxide layer 136 and are also formed over the first electrode 134. The dielectric layers 138 and 140 can contain, for example, $SiO_2$, $Si_3N_4$, or similar insulating materials. The structure comprising the tungsten oxide layer 136 and the first and second dielectric layers 138 and 140 can be formed by first forming the dielectric layers 138 and 140 as a continuous dielectric layer over the first electrode, for example by a CVD process. Next, a portion of the continuous dielectric layer is removed, for example by photolithography and etching, thereby resulting in a gap between the first and second dielectric layer formations 138 and 140. Next, the tungsten oxide layer 136 is formed in the gap between the first and second dielectric layers 138 and 140. More specifically, the tungsten oxide layer 136 can be formed by first depositing tungsten in the gap between the first and second dielectric layers 138 and 140, then performing an oxidation process so that the tungsten is oxidized. For example, a thermal oxidation process can be used such that oxidation is diffused through most or all of the tungsten layer, thereby resulting in the formation of the tungsten oxide layer 136.

The second electrode 142 can be formed of titanium nitride (TiN) and disposed over the tungsten oxide layer 136 by a CVD or PVD process. The second electrode 142 can extend over the dielectric layers 138 and 140 as well. The material of the second electrode 142 can alternatively include doped polysilicon, aluminum, copper, or tantalum nitride (TaN).

Figure 3B:
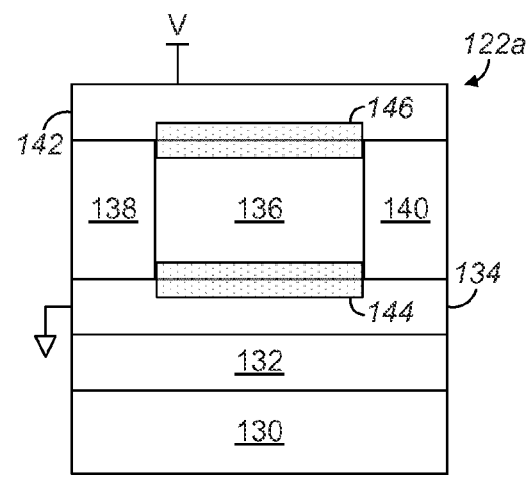

Full oxidation of the tungsten oxide layer 136 results in the formation of first and second interface regions 144 and 146 of adjustable resistance. FIG. 3B shows the respective locations of the first and second interface regions 144 and 146. The first interface region 144 includes the region at the interface of the first electrode 134 and the tungsten oxide layer 136. The second interface region 146 includes the region at the interface of the second electrode 142 and the tungsten oxide layer 136.

FIGS. 4A-4E show the resistance switching characteristics of a symmetrical two-state embodiment of the resistance switching device 122a. That is, in the present embodiment, the resistance switching device 122a includes two interface regions 144 and 146, each having two resistance values (memory states), and each being at least substantially symmetrical to the other. Alternative embodiments, including those described herein, can include embodiments that are not symmetric and/or include more than two resistance values per interface region.

The resistance between the first and second electrodes 134 and 142 through the tungsten oxide layer 136 can be adjusted between two resistance values R1 and R2. The resistance switching behavior of the resistance switching device 122a will occur at either the first interface region 144 or the second interface region 146. As will be described in more detail with reference to FIGS. 4A-4E, a voltage pulse can be used to select between the first and second interface regions 144 and 146 as the interface region for controlling the switching behavior of the resistance switching device 122a. This is significant because the voltage level required to switch the resistance value from R1 to R2 or vice-versa will depend on whether the first or second interface region 144/146 is currently controlling the switching behavior of the resistance switching device 122a.

Figure 4A:
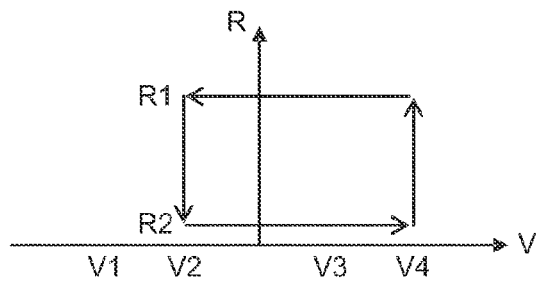
FIGS. 4A-4E show resistance switching characteristics of a symmetrical two-state embodiment of the resistance switching device shown in FIGS. 3A and 3B.

Turning first to FIG. 4A, this graph shows the resistance switching characteristics of the present embodiment of the resistance switching device 122a while the second interface region 146 is controlling the resistance switching characteristics. Here, the resistance switching device 122a can be controlled to either have a reset resistance R1 or a set resistance R2. If the resistance of the resistance switching device 122a is R1, the resistance can be decreased from R1 to R2 by applying a negative voltage V2 across the resistance switching device 122a as shown in FIG. 3B between the voltage supply terminal and ground. Similarly, if the resistance of the resistance switching device 122a is R2, the resistance can be increased from R2 to R1 by applying a positive voltage V4 across the resistance switching device 122a.

Figure 4B:
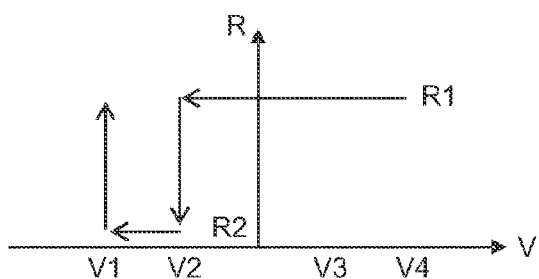

FIG. 4B shows the process for switching control from the second interface region 146 to the first interface region 144. Specifically, the control of the resistance switching characteristics of the present embodiment of the resistance switching device 122a can be switched from the second interface region 146 to the first interface region 144 by applying a negative voltage V1 across the resistance switching device 122a.

Figure 4C:
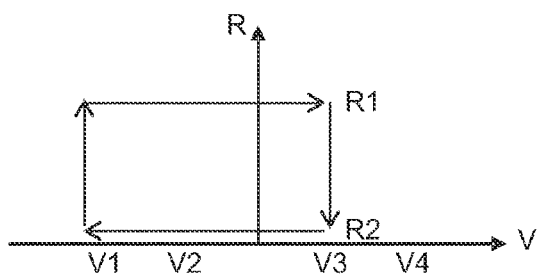

The result of the switch at FIG. 4B is shown in FIG. 4C, where the first interface region 146 is now controlling the resistance switching characteristics of the present embodiment of the resistance switching device 122a. The behavior illustrated in FIG. 4C can be compared with that of FIG. 4A in order to observe the difference between the resistance switching characteristics of the present embodiment of the resistance switching device 122a when the first interface region 144 is controlling and the resistance switching characteristics of the present embodiment of the resistance switching device 122a when the second interface region 146 is controlling. Now, at FIG. 4C, with the first interface region 144 controlling, the resistance can be decreased from R1 to R2 by applying a positive voltage V3 across the resistance switching device 122a, and resistance can be increased from R2 to R1 by applying a negative voltage V1 across the resistance switching device 122a.

Figure 4D:
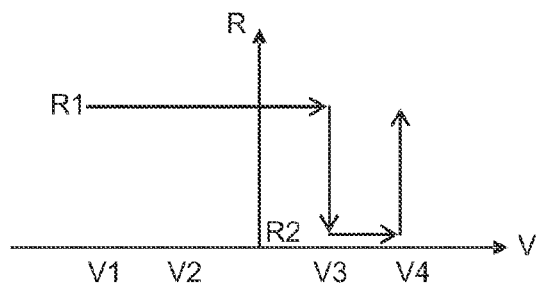

FIG. 4D shows the process for switching control from the first interface region 144 to the second interface region 146. Specifically, the control of the resistance switching characteristics of the present embodiment of the resistance switching device 122a can be switched from the first interface region 144 to the second interface region 146 by applying a positive voltage V4 across the resistance switching device 122a.

Figure 4E:
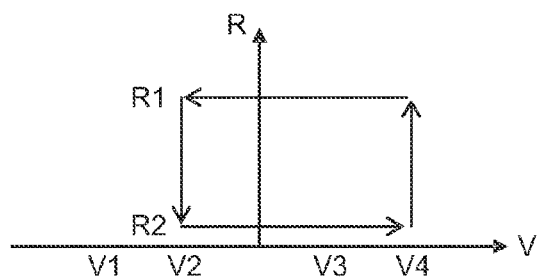

The result of the switch at FIG. 4D is shown in FIG. 4E, identical to FIG. 4A, where once again the second interface region 146 is controlling the resistance switching characteristics of the present embodiment of the resistance switching device 122a.

Thus, the resistance switching device 122a can be set to any of four states, which can serve as four memory states: (1) first interface controlling and resistance=R1 (state "$R_{RESET}$"); (2) first interface controlling and resistance=R2 (state "$R_{SET}$"); (3) second interface controlling and resistance=$\overline{R1}$ (state "$\overline{R_{RESET}}$"); and (4) second interface controlling and resistance=R2 (state "$\overline{R_{SET}}$"). It is difficult to distinguish between the states $R_{SET}$ and $\overline{R_{SET}}$. However, the states $R_{RESET}$ and $\overline{R_{RESET}}$ can be reliably distinguished from each other. Also, each of the states $R_{RESET}$ and $\overline{R_{RESET}}$ can be reliably distinguished from the states $\overline{R_{SET}}$ and $R_{SET}$. Thus, the resistance switching device 122a according to the present embodiment can be configured to serve as a three-state memory device having states (1) $R_{RESET}$; (2) $\overline{R_{RESET}}$; and (3) $R_{SET}$ or $\overline{R_{SET}}$.

Figure 5:
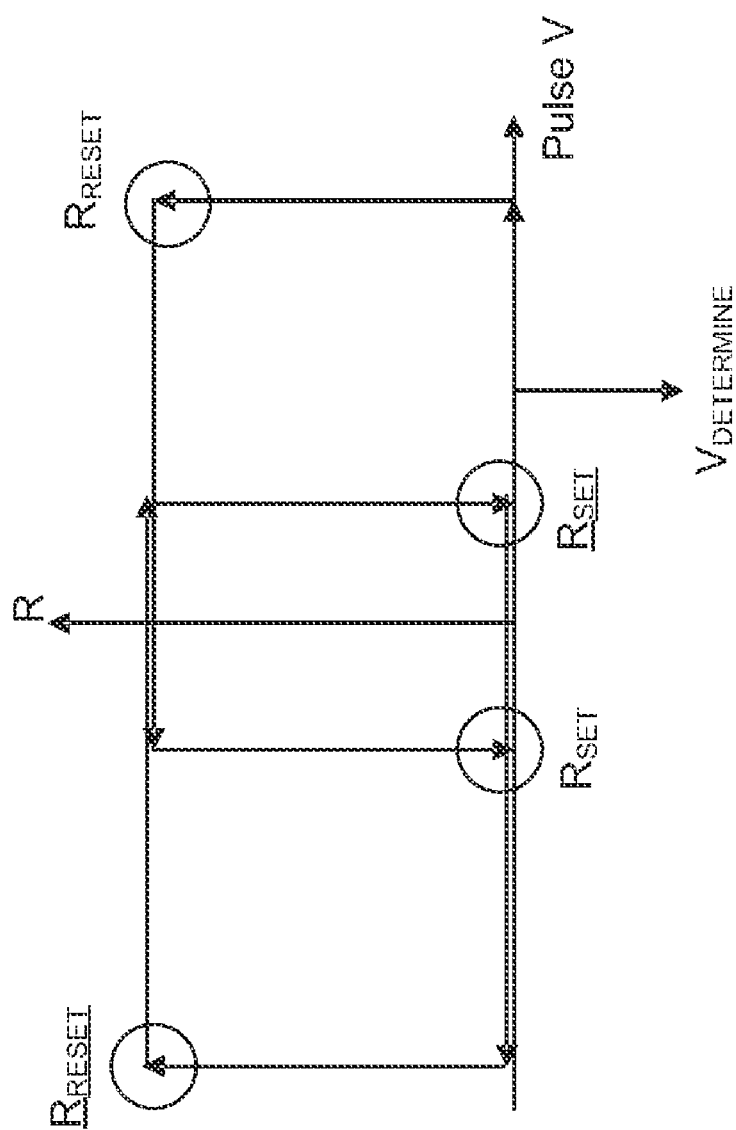
FIG. 5 shows a graphical representation of relationships between the memory states of, and applied voltages to, a symmetrical two-state embodiment of the resistance switching device shown in FIGS. 3A and 3B.
Figure 6:
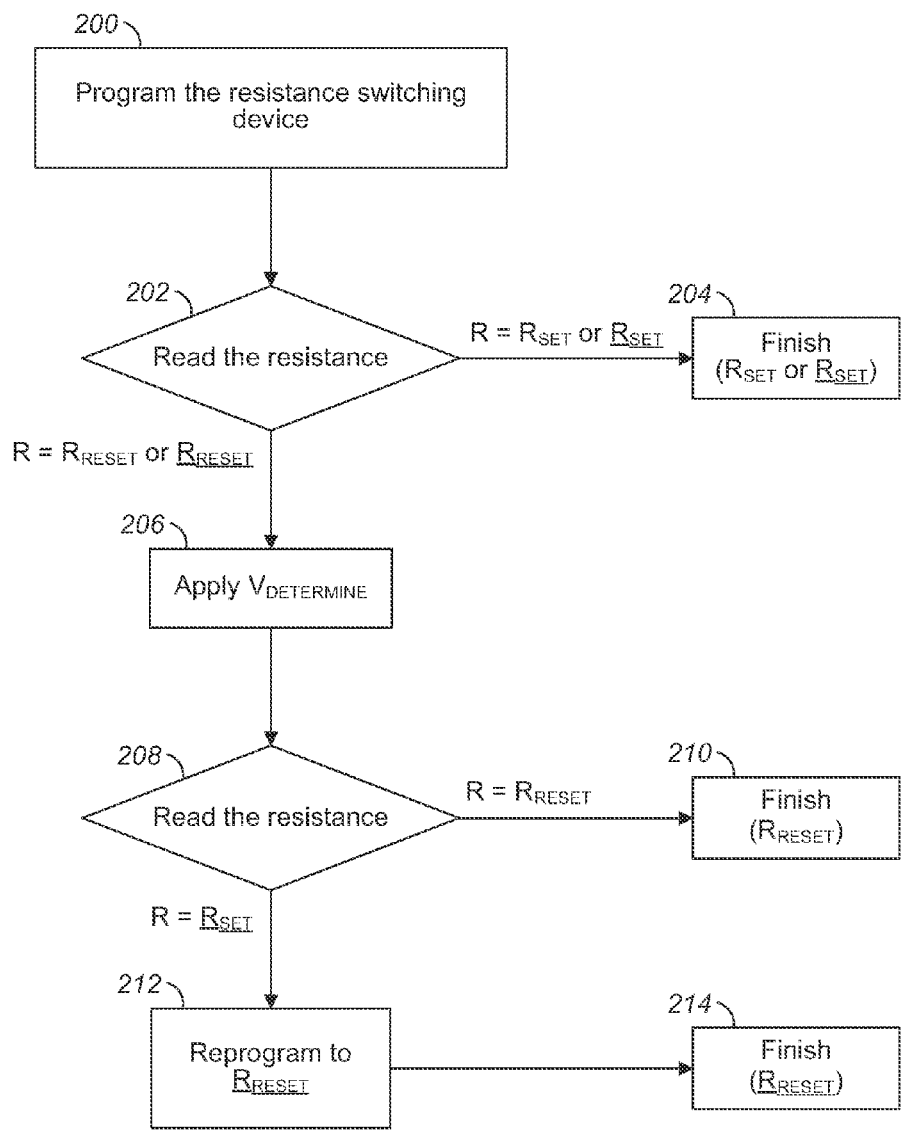
FIG. 6 shows a flowchart of a reading process for reading the symmetrical two-state embodiment of the resistance switching device shown in FIGS. 3A and 3B.

A process for reading the resistance switching device 122a according to an embodiment as a three-state memory device is next described with reference to FIGS. 5 and 6. FIG. 5 shows a graphical representation of the relationships between the memory states of, and applied voltages to, the resistance switching device 122a, and FIG. 6 shows a flowchart of the reading process.

First, at block 200, the resistance switching device 122a has been programmed to one of the memory states (1) $R_{RESET}$; (2) $\overline{R_{RESET}}$; and (3) $R_{SET}$ or $\overline{R_{SET}}$. The remainder of the process will allow for reading the resistance switching device 122a in order to determine which of the memory states was written to the resistance switching device 122a. At block 202, the resistance of the resistance switching device 122a is determined. As shown in FIG. 5, the resistance can be expected to either be a higher resistance $R_{RESET}/\overline{R_{RESET}}$ or a lower resistance $R_{SET}/\overline{R_{SET}}$ regardless of which of the first and second interface regions 144 and 146 is controlling. If the lower resistance value $R_{SET}/\overline{R_{SET}}$ is detected, the process ends at block 204 with a determination that the memory state of the resistance switching device 122a is $R_{SET}/\overline{R_{SET}}$. Otherwise, if the higher resistance $R_{RESET}/\overline{R_{RESET}}$ is detected, the process continues in order to distinguish between the $R_{RESET}$ memory state and the $\overline{R_{RESET}}$ memory state.

The memory state $R_{RESET}$ can be distinguished from the $\overline{R_{RESET}}$ memory state by determining which of the first and second interface regions 144 and 146 is controlling. In the process shown in FIG. 6, this is accomplished by applying a voltage $V_{DETERMINE}$ for which the behavior of the resistance switching device will differ depending on which of first and second interface regions 144 and 146 is controlling. An example of a voltage level that can be used as the $V_{DETERMINE}$ is shown in FIG. 5. Here, the voltage level $V_{DETERMINE}$ is a voltage level between voltage levels V3 and V4 shown in FIGS. 4A-4E. Recalling that at block 206 it is known that the resistance level is high (e.g., R1 in FIGS. 4A-4E), it can be appreciated that the behavior of the resistance memory device 122a will differ when the voltage $V_{DETERMINE}$ is applied across the resistance memory device 122a depending on which of the first and second interface regions 144 and 146 is controlling. For example, according to FIG. 4A if the second interface region 146 is controlling, then the application of voltage $V_{DETERMINE}$ will not change the resistance of the resistance memory device 122a from resistance R1. On the other hand, according to FIG. 4D if the first interface region 144 is controlling, then the application of voltage $V_{DETERMINE}$ will change the resistance of the resistance memory device 122a from resistance R1 to resistance R2.

Thus, at block 206 a voltage $V_{DETERMINE}$ is applied across the resistance switching device 122a, and then at block 208 the resistance of the resistance switching device 122a is measured. If the higher resistance value $R_{RESET}/\overline{R_{RESET}}$ is still detected, it can be determined that the $\overline{second}$ interface region 146 is controlling since the resistance value was not changed by the application of $V_{DETERMINE}$. Thus, the process ends at block 210 with a determination that the memory state of the resistance switching device 122a is the $R_{RESET}$ memory state. Otherwise, if the lower resistance value $R_{SET}/\overline{R_{SET}}$ is detected, it can be determined that the first $\overline{interface}$ region 144 was controlling since the resistance value was changed by the application of $V_{DETERMINE}$. Note that in this case, the application of $V_{DETERMINE}$ switched control from the first interface region 144 to the second interface region 146. Thus, the process continues with block 212, where switching control is switched back to the first interface region 144 so that the memory state of the resistance memory device 122a is not disturbed by the present read process. Then the process ends at block 214 with a determination that the memory state of the resistance switching device 122a is the $\overline{R_{RESET}}$ memory state.

Figure 7:
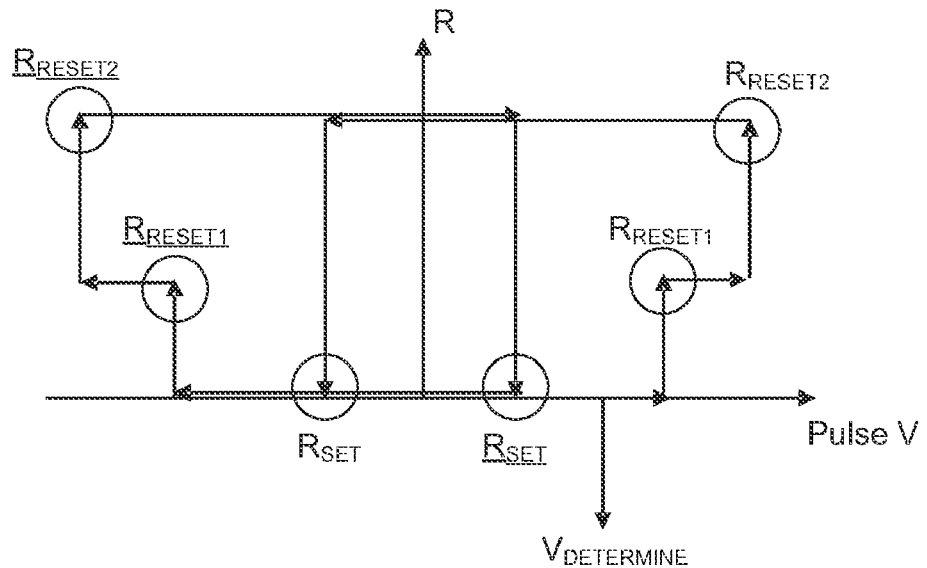
FIG. 7 shows the switching characteristics of a symmetrical three-state embodiment of the resistance switching device shown in FIGS. 3A and 3B.
Figure 8:
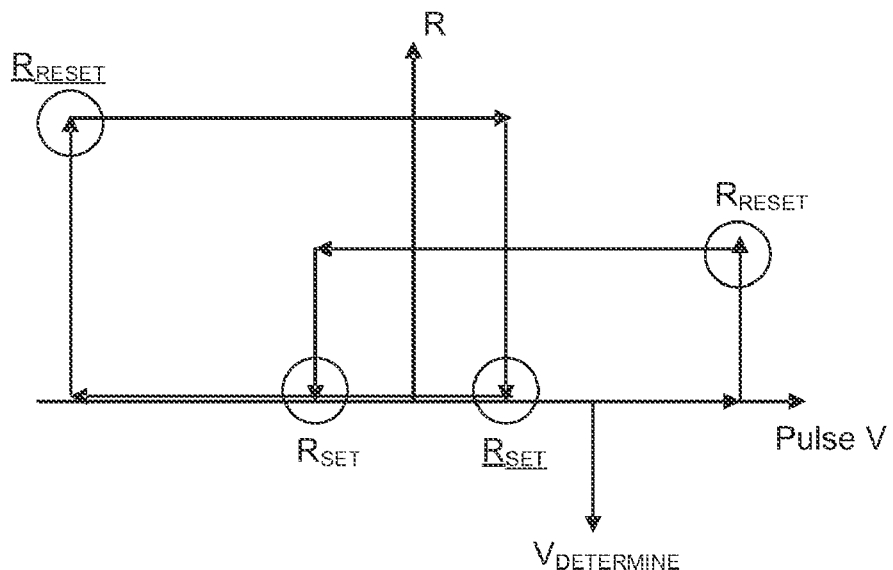
FIG. 8 shows the switching characteristics of an asymmetrical two-state embodiment of the resistance switching device shown in FIGS. 3A and 3B.
Figure 9:
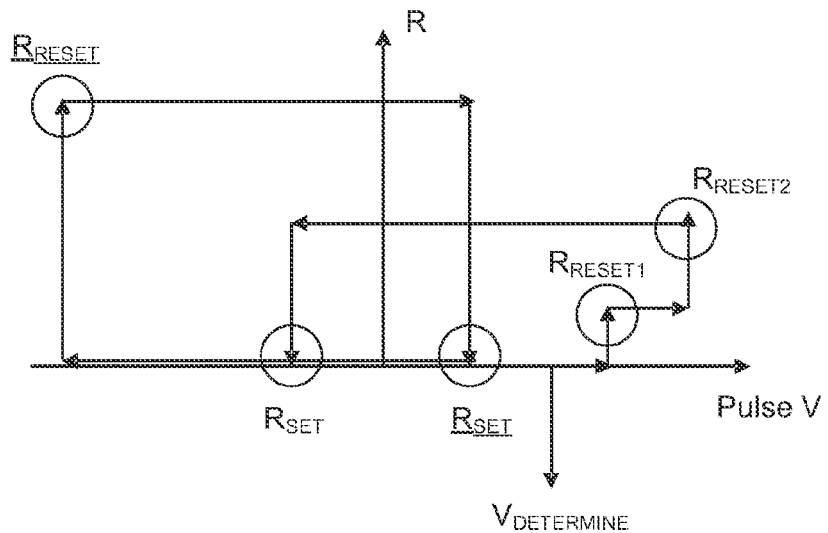
FIG. 9 shows the switching characteristics of an asymmetrical two/three-state embodiment of the resistance switching device shown in FIGS. 3A and B.

FIGS. 7-9 show the resistance switching characteristics of alternative embodiments of the resistance switching device 122a. More specifically, FIG. 7 shows the switching characteristics of a symmetrical three-state embodiment of the resistance switching device 122a; FIG. 8 shows the switching characteristics of an asymmetrical two-state embodiment of the resistance switching device 122a; and FIG. 9 shows the switching characteristics of an asymmetrical two/three-state embodiment of the resistance switching device 122a. These and other such alternative embodiments can be manufactured by varying the composition of the electrode layers 134 and 142 and/or the composition of the tungsten oxide layer 136. For example, where the electrode layers 134 and 142 are formed of TiN, the resistance associated with the $R_{RESET}$ or $\overline{R_{RESET}}$ state can be increased or decreased depending on the nitrogen content of the TiN. Similarly, the resistance associated with the $R_{RESET}$ or $\overline{R_{RESET}}$ state can be increased or decreased depending on the oxygen content of the tungsten oxide layer 136.

The switching characteristics of a symmetrical three-state embodiment of the resistance switching device 122a such as shown in FIG. 7 includes three resistance values (memory states) per interface region 144/146. The memory states for while the first interface region 144 is controlling are $R_{SET}$, $R_{RESET1}$, and $R_{RESET2}$. The memory states for while the second interface region 146 is controlling are $\overline{R_{SET}}$, $\overline{R_{RESET1}}$, and $\overline{R_{RESET2}}$. It is difficult to distinguish between the states $R_{SET}$ and $\overline{R_{SET}}$. However, the states $R_{RESET1}$, $R_{RESET2}$, $\overline{R_{RESET1}}$, and $\overline{R_{RESET2}}$ can be reliably distinguished from each other. Also, each of the states $R_{RESET1}$, $R_{RESET2}$, $\overline{R_{RESET1}}$, and $\overline{R_{RE-SET2}}$ can be reliably distinguished from the states $R_{SET}$ and $\overline{R_{SET}}$. Thus, the resistance switching device 122a according to the present embodiment can be configured to serve as a five-state memory device having states (1) $R_{RESET1}$; (2) $R_{RESET2}$; (3) $\overline{R_{RESET1}}$, (4) $\overline{R_{RESET2}}$; and (5) $R_{SET}$ or $\overline{R_{SET}}$.

The switching characteristics of an asymmetrical two-state embodiment of the resistance switching device 122a such as shown in FIG. 8 includes two resistance values (memory states) per interface region 144/146 where the $R_{RESET}$ resistance is distinguishably different from the $\overline{R_{RESET}}$ resistance. The memory states for while the first interface region 144 is controlling are $R_{SET}$ and $R_{RESET}$. The memory states for while the second interface region 146 is controlling are $\overline{R_{SET}}$ and $\overline{R_{RESET}}$. It is difficult to distinguish between the states $R_{SET}$ and $\overline{R_{SET}}$. However, the states $R_{RESET}$ and $\overline{R_{RESET}}$ can be reliably distinguished from each other. Also, each of the states $R_{RESET}$ and $\overline{R_{RESET}}$ can be reliably distinguished from the states $R_{SET}$ and $\overline{R_{SET}}$. Thus, the resistance switching device 122a according to the present embodiment can be configured to serve as a three-state memory device having states (1) $R_{RESET}$; (2) $\overline{R_{RESET}}$; and (3) $R_{SET}$ or $\overline{R_{SET}}$.

Figure 10:
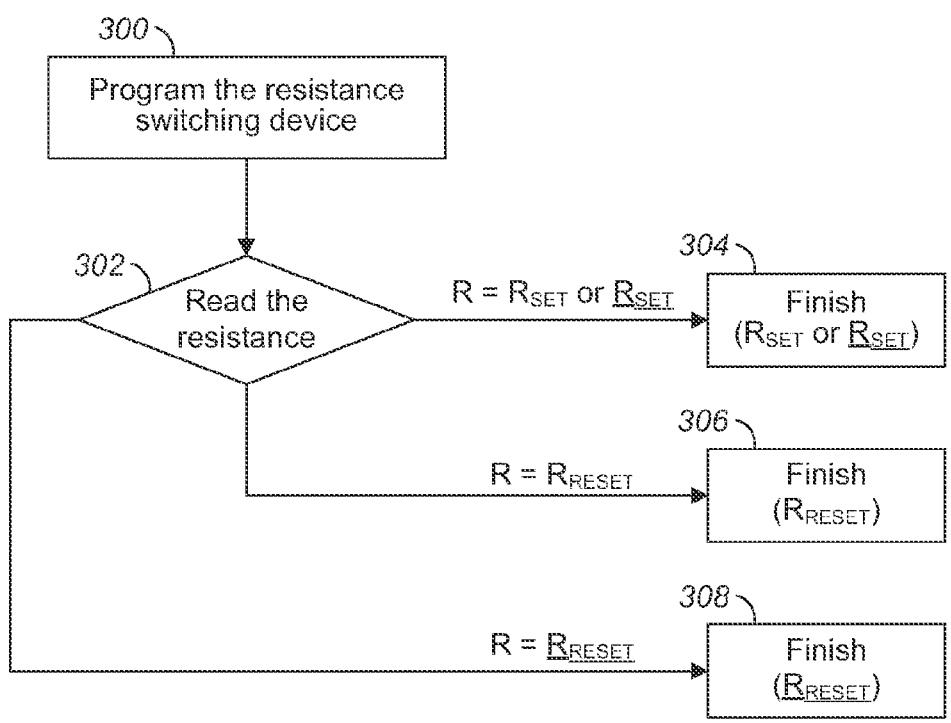
FIG. 10 shows a process for reading the resistance switching device according to the asymmetrical embodiment shown in FIG. 8.

FIG. 10 shows a process for reading the resistance switching device 122a according to the asymmetrical embodiment shown in FIG. 8. First, at block 300, the resistance switching device 122a has been programmed to one of the memory states (1) $R_{RESET}$; (2) $\overline{R_{RESET}}$; and (3) $R_{SET}$ or $\overline{R_{SET}}$. The remainder of the process will allow for reading the resistance switching device 122a in order to determine which of the memory states was written to the resistance switching device 122a. At block 302, the resistance of the resistance switching device 122a is determined. As shown in FIG. 8, the resistance can be expected to be one of a first resistance $R_{RESET}$, a second resistance $\overline{R_{RESET}}$, or a third resistance $R_{SET}/\overline{R_{SET}}$ regardless of which of the first and second interface regions 144 and 146 is controlling. If the resistance value $R_{SET}/\overline{R_{SET}}$ is detected, the process ends at block 304 with a determination that the memory state of the resistance switching device 122a is $R_{SET}/\overline{R_{SET}}$. If the resistance value $R_{RESET}$ is detected, the process ends at block 306 with a determination that the memory state of the resistance switching device 122a is $R_{RE-SET}$. If the resistance value $\overline{R_{RESET}}$ is detected, the process ends at block 308 with a determination that the memory state of the resistance switching device 122a is $\overline{R_{RESET}}$.

Referring again to FIG. 9, the switching characteristics of an asymmetrical two/three-state embodiment of the resistance switching device 122a includes two resistance values (memory states) associated with the first interface region 144 and three resistance values (memory states) associated with the second interface region 146. The memory states for while the first interface region 144 is controlling are $R_{SET}$ and $R_{RESET}$. The memory states for while the second interface region 146 is controlling are $\overline{R_{SET}}$, $\overline{R_{RESET1}}$, and $\overline{R_{RESET2}}$. It is difficult to distinguish between the states $R_{SET}$ and $\overline{R_{SET}}$. However, the states $R_{RESET}$, $\overline{R_{RESET1}}$, and $\overline{R_{RESET2}}$ can be reliably distinguished from each other. Also, each of the states $R_{RESET}$, $\overline{R_{RESET1}}$, and $\overline{R_{RESET2}}$ can be reliably distinguished from the states $R_{SET}$ and $\overline{R_{SET}}$. Thus, the resistance switching device 122a according to the present embodiment can be configured to serve as a four-state memory device having states (1) $R_{RESET}$; (2) $\overline{R_{RESET1}}$; (3) $\overline{R_{RESET2}}$; and (4) $R_{SET}$ or $\overline{R_{SET}}$.

Figure 11:
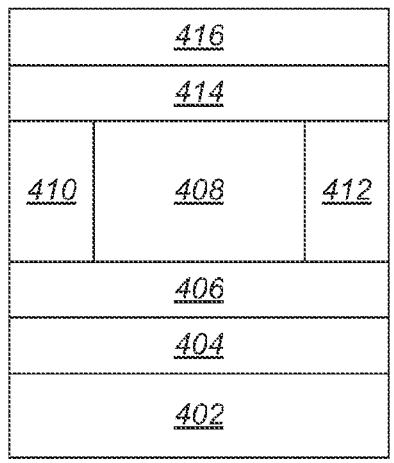
FIG. 11 shows a schematic view of a resistance switching device according to some embodiments of the resistance switching device shown in FIG. 2.

FIG. 11 shows a schematic view of a resistance switching device 122b according to some embodiments of the resistance switching device 122. The resistance switching device 122b includes a programmable metallization cell (PMC). The resistance switching device 122b includes a substrate 402, an intermetal dielectric (IMD) layer 404, a first electrode layer 406, a conductive plug layer 408, first and second dielectric layers 410 and 412, a solid electrolyte layer 414, and a second electrode layer 416.

The substrate 402 can be a silicon substrate, and the intermetal dielectric layer 404 can be an oxide layer or other electrically-insulating layer formed on the substrate 402 by known methods, for example by chemical vapor deposition (CVD).

The first electrode layer 406 can be formed of titanium nitride (TiN) and disposed on the IMD layer 404 by a CVD or physical vapor deposition (PVD) process. Alternatively, the material of the first electrode 406 can include doped polysilicon, aluminum, copper, or tantalum nitride (TaN).

The conductive plug layer 408 is formed over the first electrode 406. The first and second dielectric layers 410 and 412 flank the conductive plug layer 408 and are also formed over the first electrode 406. The dielectric layers 410 and 412 can contain, for example, $SiO_2$, $Si_3N_4$, or similar insulating materials. The conductive plug layer 408 can contain tungsten. The structure comprising the conductive plug layer 408 and the first and second dielectric layers 410 and 412 can be formed by first forming the dielectric layers 410 and 412 as a continuous dielectric layer over the first electrode 406, for example by a CVD process. Next, a portion of the continuous dielectric layer is removed, for example by photolithography and etching, thereby resulting in a gap between the first and second dielectric layer formations 410 and 412. Next, the conductive plug layer 408 is formed in the gap between the first and second dielectric layers 410 and 412. More specifically, the conductive plug layer 408 can be formed by depositing the material of the conductive plug layer 408 in the gap between the first and second dielectric layers 410 and 412.

The solid electrolyte layer 414 can be formed by deposition over the conductive plug layer 408. The solid electrolyte layer 414 can also extend over the dielectric layers 410 and 412. The solid electrolyte layer 414 can include transition metal oxide or materials that contain at least one chalcogenide element. For example, the solid electrolyte layer 414 can contain GeS/Ag or GeSe/Ag.

The second electrode layer 416 can be formed by deposition over the solid electrolyte layer 414. The second electrode layer 416 can be an oxidizable electrode. The second electrode layer 416 can contain an oxidizable electrode material, for example Ag, Cu, or Zn.

Figure 12:
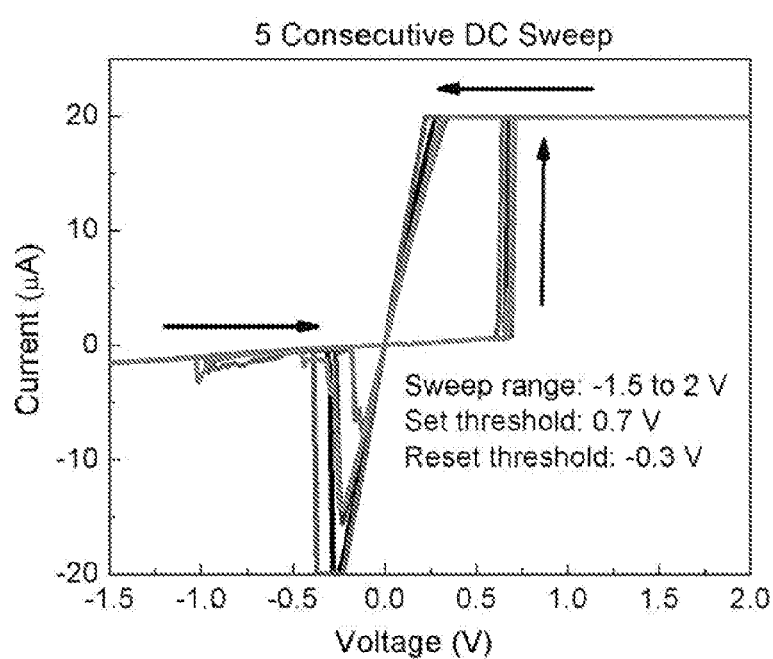
FIG. 12 shows a diagram of the voltage and current occurring during programming and read operations of the resistance switching device shown in FIG. 11.

The embodiment of the resistance switching device 122b shown in FIG. 11 forms a single PMC structure. FIG. 12 shows a diagram of the voltage and current occurring during programming and read operations of an example of the single PMC embodiment of the resistance switching device 122b. The exact voltage and current levels can vary from those shown in FIG. 12.

At the start, resistance switching device 122b may not programmed and may therefore have a high resistance. If a voltage is applied with a higher voltage at the second electrode layer 416 and a lower voltage at the first electrode layer 406, no current may flow through the resistance switching device 122b until a set threshold voltage (V1, or programming voltage) is applied. In the illustrated example, the set threshold voltage V1 may be, for example, about 0.7 volts. When the applied voltage rises over the threshold voltage V1, current may flow until a working current IW is achieved and may be confined (e.g., limited) by the programming circuit. In one embodiment, the voltage may then be reduced to 0 Volts, whereby the current falls to 0 amps, thereby completing the programming of the resistance switching device 122b.

If the cell state is to be sensed or read, a sensing voltage (VS) may be applied to the resistance switching device 122b. The sensing voltage VS may be lower than the threshold voltage V1. In the illustrated example, the sensing voltage VS may be, for example, about 0.3 volts. When the resistance switching device 122b is programmed (SET) as described above and the sensing voltage VS is applied to the resistance switching device 122b, a working current IW may flow through the resistance switching device 122b. If the resistance switching device 122b is not programmed (RESET), little or no current may flow through the resistance switching device 122b when the sensing voltage VS is applied.

In one embodiment, a lower voltage, e.g., a negative voltage (also referred to as a reset threshold voltage) may be applied to the resistance switching device 122b in order to erase or reset the program status. In the illustrated example, the reset threshold voltage may be, for example, about −0.3 volts. When the reset threshold voltage is applied to the resistance switching device 122b, a negative current may flow through the resistance switching device 122b. When the negative voltage drops to below the reset threshold voltage, the current may stop flowing (i.e., decrease to 0 Amps). After the reset threshold voltage has been applied to the resistance switching device 122b, the resistance switching device 122b may have the same high resistance as prior to the programming operation, thereby erasing or resetting the value stored in the resistance switching device 122b.

Figure 13:
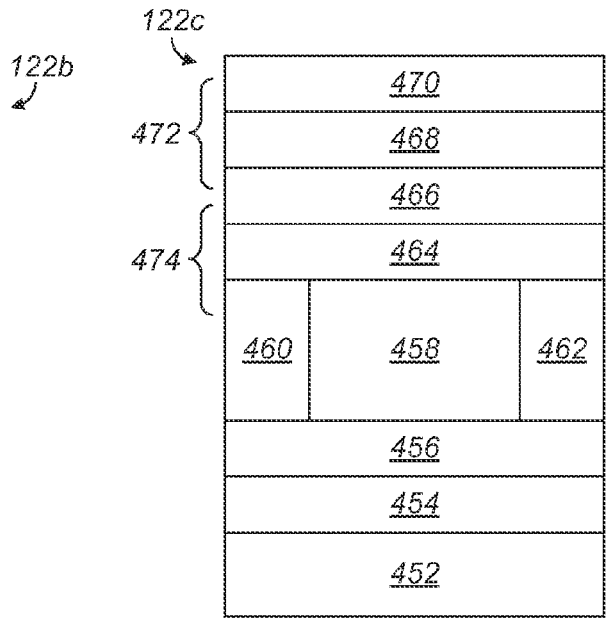
FIG. 13 shows a schematic view of a resistance switching device according to some embodiments of the resistance switching device shown in FIG. 2.

FIG. 13 shows a schematic view of a resistance switching device 122c according to some embodiments of the resistance switching device 122. The resistance switching device 122c includes a dual PMC structure. The resistance switching device 122c includes a substrate 452, an intermetal dielectric (IMD) layer 454, a first electrode layer 456, a conductive plug layer 458, first and second dielectric layers 460 and 462, a first solid electrolyte layer 464, a second electrode layer 466, a second solid electrolyte layer 468, and a third electrode layer 470.

The substrate 452 can be a silicon substrate, and the intermetal dielectric layer 454 can be an oxide layer or other electrically-insulating layer formed on the substrate 452 by known methods, for example by chemical vapor deposition (CVD).

The first electrode layer 456 can be formed of titanium nitride (TiN) and disposed on the IMD layer 454 by a CVD or physical vapor deposition (PVD) process. Alternatively, the material of the first electrode 456 can include doped polysilicon, aluminum, copper, or tantalum nitride (TaN).

The conductive plug layer 458 is formed over the first electrode 456. The first and second dielectric layers 460 and 462 flank the conductive plug layer 458 and are also formed over the first electrode 456. The dielectric layers 460 and 462 can contain, for example, $SiO_2$, $Si_3N_4$, or similar insulating materials. The conductive plug layer 458 can contain tungsten. The structure comprising the conductive plug layer 458 and the first and second dielectric layers 460 and 462 can be formed by first forming the dielectric layers 460 and 462 as a continuous dielectric layer over the first electrode 456, for example by a CVD process. Next, a portion of the continuous dielectric layer is removed, for example by photolithography and etching, thereby resulting in a gap between the first and second dielectric layer formations 460 and 462. Next, the conductive plug layer 458 is formed in the gap between the first and second dielectric layers 460 and 462. More specifically, the conductive plug layer 458 can be formed by depositing the material of the conductive plug layer 458 in the gap between the first and second dielectric layers 460 and 462.

The first solid electrolyte layer 464 can be formed by deposition over the conductive plug layer 458. The first solid electrolyte layer 464 can also extend over the dielectric layers 460 and 462. The first solid electrolyte layer 464 can include transition metal oxide or materials that contain at, least one chalcogenide element. For example, the first solid electrolyte layer 464 can contain GeS/Ag or GeSe/Ag.

The second electrode layer 466 can be formed by deposition over the first solid electrolyte layer 464. The second electrode layer 466 can be an oxidizable electrode. The second electrode layer 466 can contain an oxidizable electrode material, for example Ag, Cu, or Zn.

The second solid electrolyte layer 468 can be formed by deposition over the second electrode layer 466. The second solid electrolyte layer 468 can include transition metal oxide or materials that contain at least one chalcogenide element. For example, the second solid electrolyte layer 468 can contain GeS/Ag or GeSe/Ag.

The third electrode layer 470 can be formed by deposition over the second solid electrolyte layer 468. The third electrode layer 470 can contain a conductive or semiconductive material, for example TiN.

The embodiment of the resistance switching device 122c shown in FIG. 13 forms a dual PMC structure, including upper PMC structure 472 and lower PMC structure 474. Each of the PMC structures 472 and 474 is capable of being programmed to two respective memory states corresponding to respective resistances. The memory states of the upper PMC structure 472 include memory states designated $R_{RESET}$ and $R_{SET}$, which correspond to relatively higher and lower resistance values, respectively. The memory states of the lower PMC structure 474 include memory states designated $\overline{R_{RESET}}$ and $\overline{R_{SET}}$, which correspond to relatively higher and lower resistance values, respectively. In some embodiments, the resistance value associated with $R_{RESET}$ can be substantially equal to the resistance value associated with $\overline{R_{RESET}}$, while in other embodiments the respective resistance values associated with $R_{RESET}$ and $\overline{R_{RESET}}$ can differ from each other. Similarly, in some embodiments, the resistance value associated with $R_{SET}$ can be substantially equal to the resistance value associated with $\overline{R_{SET}}$, while in other embodiments the respective resistance values associated with $R_{SET}$ and $\overline{R_{SET}}$ can differ from each other.

Figure 14:
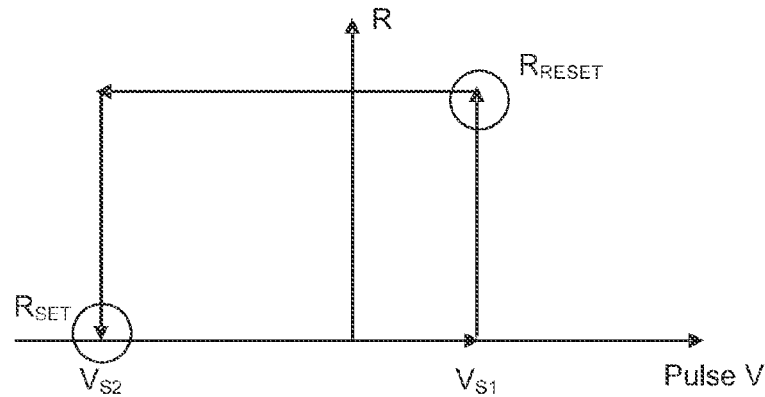
FIG. 14 shows the resistance switching characteristics of the upper PMC structure of a symmetrical, dual-PMC embodiment of the resistance switching device shown in FIG. 13.
Figure 15:
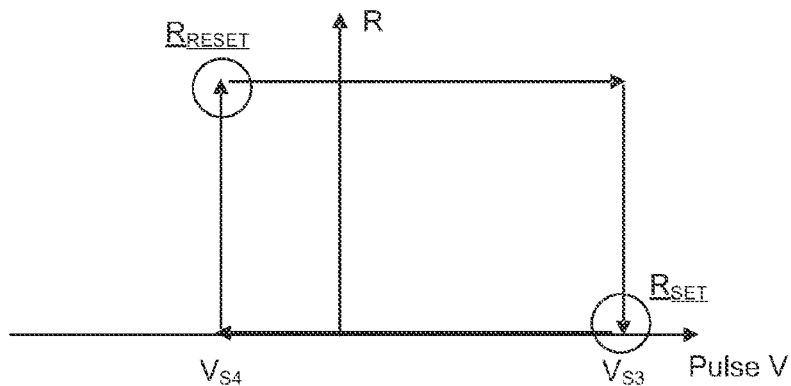
FIG. 15 shows the resistance switching characteristics of the lower PMC structure of a symmetrical, dual-PMC embodiment of the resistance switching device shown in FIG. 13.
Figure 16:
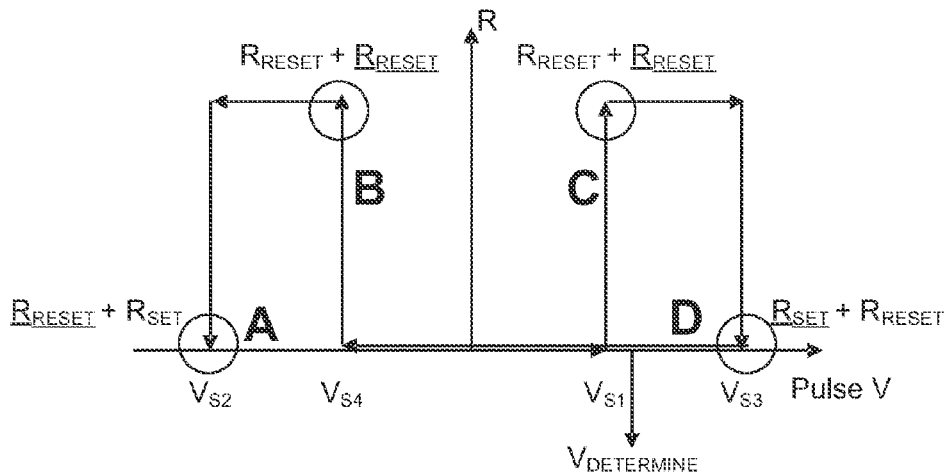
FIG. 16 shows the resistance switching characteristics of a dual-PMC structure that includes upper and lower PMC structures having the resistance switching characteristics shown in FIGS. 14 and 15, respectively.

FIGS. 14-16 show diagrams of the resistance switching characteristics of a symmetrical, dual-PMC embodiment of the resistance switching device 122c. More specifically, FIG. 14 shows the resistance switching characteristics of the upper PMC structure 472, FIG. 15 shows the resistance switching characteristics of the lower PMC structure 474, and FIG. 16 shows the overall resistance switching characteristics of the symmetrical embodiment of the dual-PMC structure that is formed by the upper and lower PMC structures 472 and 474.

As shown in FIG. 14, a positive voltage $V_{S1}$ across the upper PMC structure 472 will cause the resistance of the upper PMC structure 472 to switch to the resistance value associated with memory state $R_{RESET}$. A negative voltage $V_{S2}$ across the upper PMC structure 472 will cause the resistance of the upper PMC structure 472 to switch to the resistance value associated with memory state $R_{SET}$.

As shown in FIG. 15, a positive voltage $V_{S3}$ across the lower PMC structure 474 will cause the resistance of the lower PMC structure 474 to switch to the resistance value associated with memory state $\overline{R_{SET}}$. A negative voltage $V_{S4}$ across the lower PMC structure 474 will cause the resistance of the lower PMC structure 474 to switch to the resistance value associated with memory state $\overline{R_{RESET}}$.

The combination of the symmetrical embodiment of the upper and lower PMC structures 472 and 474 as shown in FIGS. 14 and 15 results in a memory device capable of four memory states A-D as shown in FIG. 16. Each of the memory states A-D is associated with a respective sum of resistances of the memory states of the upper and lower PMC structures 472 and 474. The memory state A occurs when the resistance of the upper PMC structure 472 has the resistance associated with memory state $R_{SET}$ and the lower PMC structure 474 has the resistance associated with memory state $\overline{R_{RESET}}$ so that the overall resistance of the dual PMC structure for memory state A is $R_{SET}+\overline{R_{RESET}}$. The memory state D occurs when the resistance of the upper PMC structure 472 has the resistance associated with memory state $R_{RESET}$ and the lower PMC structure 474 has the resistance associated with memory state $\overline{R_{SET}}$ so that the overall resistance of the dual PMC structure for memory state D is $R_{SET}+\overline{R_{RESET}}$. The memory states B and C both occur when the resistance of the upper PMC structure 472 has the resistance associated with memory state $R_{RESET}$ and the lower PMC structure 474 has the resistance associated with memory state $\overline{R_{RESET}}$ so that the overall resistance of the dual PMC structure for memory states B and C is $R_{RESET}+\overline{R_{RESET}}$. Thus, the memory states B and C are difficult to distinguish, so the dual PMC structure of the resistance switching device 122c can be implemented as a three-state memory device having memory states A, B (or C), and D.

Figure 17:
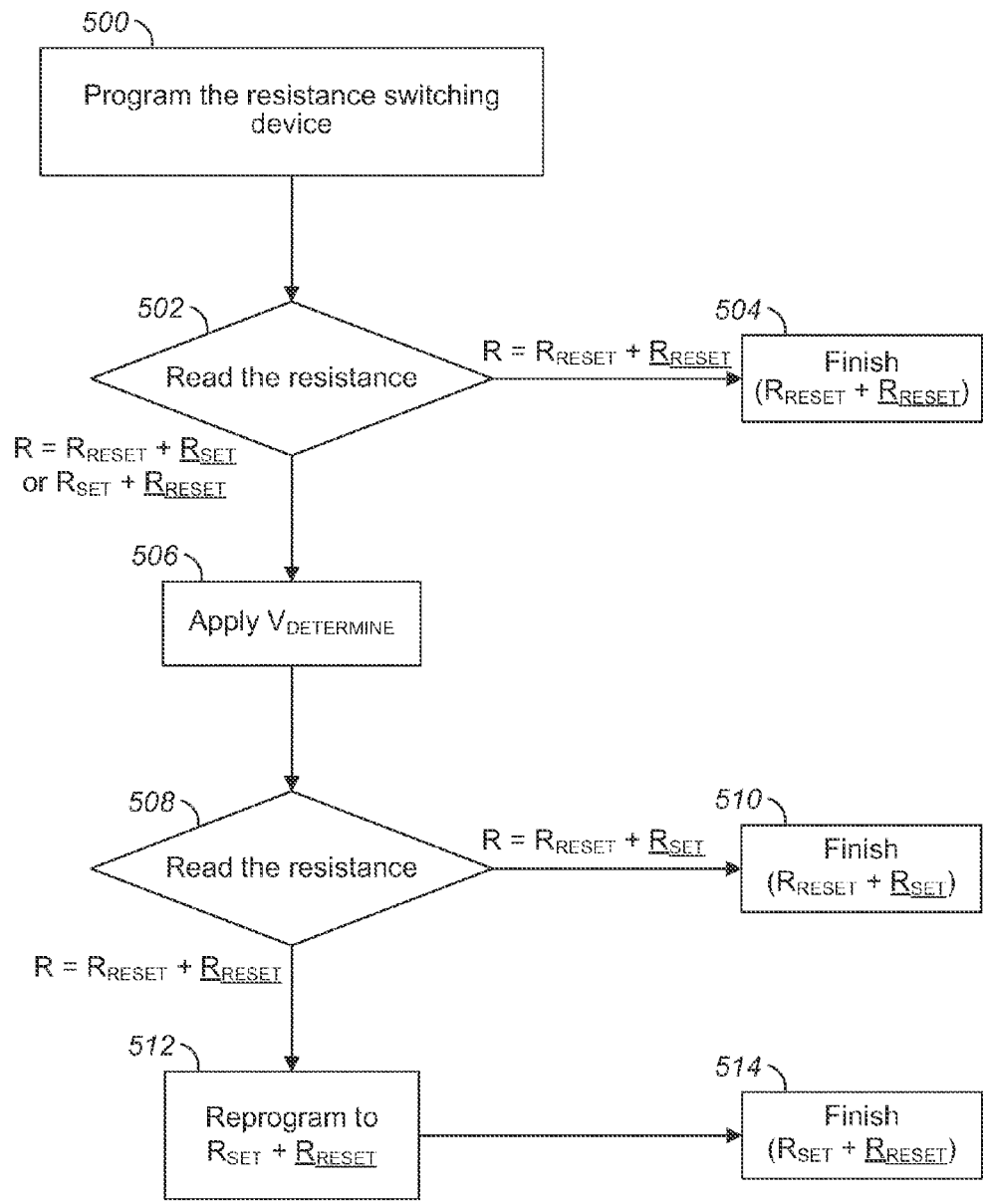
FIG. 17 shows a flowchart of a reading process for a resistance switching device shown according to FIG. 16.

A process for reading the resistance switching device 122c according to an embodiment as a three-state, symmetrical, dual-PMC memory device is next described with reference to FIG. 17, which shows a flowchart of the reading process.

First, at block 500, the resistance switching device 122c has been programmed to one of the memory states A, B/C, or D. The remainder of the process will allow for reading the resistance switching device 122c in order to determine which of the memory states was written to the resistance switching device 122c. At block 502, the resistance of the resistance switching device 122c is determined. In the present symmetrical embodiment, the resistance associated with $R_{SET}$ is substantially equal to the resistance associated with $\overline{R_{SET}}$, and the resistance associated with $R_{RESET}$ is substantially equal to the resistance associated with $\overline{R_{RESET}}$. Thus, the resistance of the resistance switching device 122c can be expected to either be a higher resistance $R=R_{RESET}+\overline{R_{RESET}}$ or a lower resistance $R=(R_{RESET}+\overline{R_{SET}})$ or $(R_{SET}+\overline{R_{RESET}})$. If the higher resistance value $R=R_{RESET}+\overline{R_{RESET}}$ is detected, the process ends at block 504 with a determination that the memory state of the resistance switching device 122c is memory state B/C ($R_{RESET}+\overline{R_{RESET}}$). Otherwise, if the lower resistance is detected, the process continues in order to distinguish between the memory states A ($R_{SET}+\overline{R_{RESET}}$) and D ($R_{RESET}+\overline{R_{SET}}$).

Next, at block 506 a voltage $V_{DETERMINE}$ is applied across the resistance switching device 122c, and then at block 508 the resistance of the resistance switching device 122c is measured. In this embodiment, a voltage for $V_{DETERMINE}$ is selected that will cause the upper PMC structure 472 to switch from $R_{SET}$ to $R_{RESET}$ if the memory state is memory state A, but will not result in any change if the memory state is memory state D. Thus, the voltage of $V_{DETERMINE}$ is a voltage between $V_{S1}$ and $V_{S3}$. Alternatively, a voltage for $V_{DETERMINE}$ can be selected between $V_{S2}$ and $V_{S4}$ that will cause the lower PMC structure 472 to switch from $R_{SET}$ to $R_{RESET}$ if the memory state is memory state D, but will not result in any change if the memory state is memory state A.

If the lower resistance value equal to $R_{RESET}+R_{SET}$ (and also equal to $R_{SET}+R_{RESET}$) is detected at block 508, it can be determined that the memory state is memory state D since the resistance value was not changed by the application of $V_{DETERMINE}$. Thus, the process ends at block 510 with a determination that the memory state of the resistance switching device 122c is the memory state D. Otherwise, if the higher resistance value $R_{RESET}+R_{RESET}$ is detected at block 508, it can be determined that the memory state is memory state A since the resistance value was changed by the application of $V_{DETERMINE}$. Note that in this case, the application of $V_{DETERMINE}$ switched the resistance value of the upper PMC structure 472 from $R_{SET}$ to $R_{RESET}$. Thus, the process continues with block 512, where the resistance of the upper PMC structure 472 is switched back to $R_{SET}$ (e.g., by application of $V_{S2}$) so that the memory state of the resistance memory device 122c is not disturbed by the present read process. Then the process ends at block 514 with a determination that the memory state of the resistance switching device 122c is the memory state A.

Figure 18:
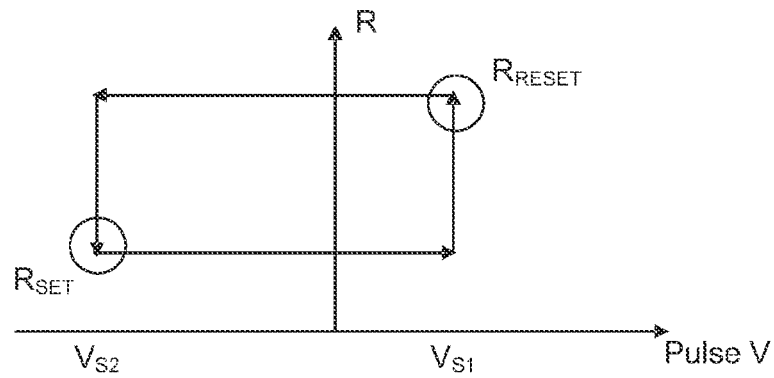
FIG. 18 shows the resistance switching characteristics of the upper PMC structure of an asymmetrical, dual-PMC embodiment of the resistance switching device shown in FIG. 13.
Figure 19:
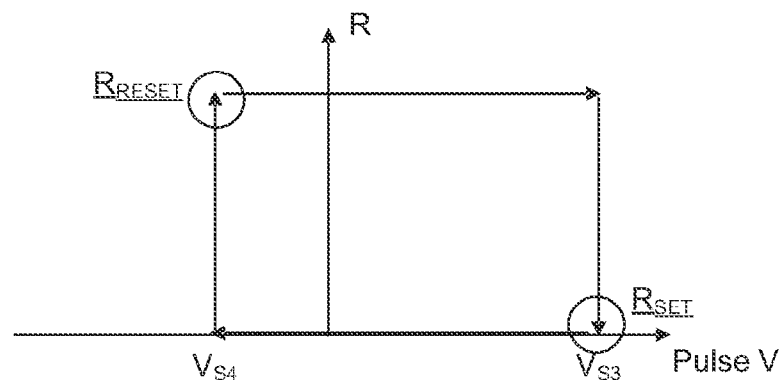
FIG. 19 shows the resistance switching characteristics of the lower PMC structure of an asymmetrical, dual-PMC embodiment of the resistance switching device shown in FIG. 13.
Figure 20:
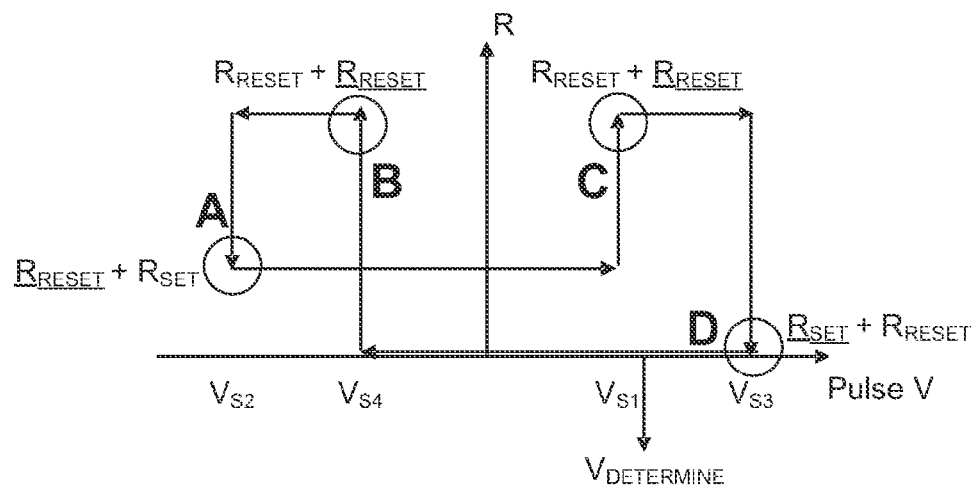
FIG. 20 shows the resistance switching characteristics of a dual-PMC structure that includes upper and lower PMC structures having the resistance switching characteristics shown in FIGS. 18 and 19, respectively.

FIGS. 18-20 show diagrams of the resistance switching characteristics of an asymmetrical, dual-PMC embodiment of the resistance switching device 122c. More specifically, FIG. 18 shows the resistance switching characteristics of the upper PMC structure 472, FIG. 15 shows the resistance switching characteristics of the lower PMC structure 474, and FIG. 16 shows the overall resistance switching characteristics of the asymmetrical embodiment of the dual-PMC structure that is formed by the upper and lower PMC structures 472 and 474.

As shown in FIG. 18, a positive voltage $V_{S1}$ across the upper PMC structure 472 will cause the resistance of the upper PMC structure 472 to switch to the resistance value associated with memory state $R_{RESET}$. A negative voltage $V_{S2}$ across the upper PMC structure 472 will cause the resistance of the upper PMC structure 472 to switch to the resistance value associated with memory state $R_{SET}$.

As shown in FIG. 19, a positive voltage $V_{S3}$ across the lower PMC structure 474 will cause the resistance of the lower PMC structure 474 to switch to the resistance value associated with memory state $R_{SET}$. A negative voltage $V_{S4}$ across the lower PMC structure 474 will cause the resistance of the lower PMC structure 474 to switch to the resistance value associated with memory state $R_{RESET}$.

The combination of the asymmetrical embodiment of the upper and lower PMC structures 472 and 474 as shown in FIGS. 18 and 19 results in a memory device capable of four memory states A-D as shown in FIG. 20. Each of the memory states A-D is associated with a respective sum of resistances of the memory states of the upper and lower PMC structures 472 and 474. The memory state A occurs when the resistance of the upper PMC structure 472 has the resistance associated with memory state $R_{SET}$ and the lower PMC structure 474 has the resistance associated with memory state $R_{RESET}$ so that the overall resistance of the dual PMC structure for memory state A is $R_{SET}+R_{RESET}$. The memory state D occurs when the resistance of the upper PMC structure 472 has the resistance associated with memory state $R_{RESET}$ and the lower PMC structure 474 has the resistance associated with memory state $R_{SET}$ so that the overall resistance of the dual PMC structure for memory state D is $R_{SET}+R_{RESET}$. The memory states B and C both occur when the resistance of the upper PMC structure 472 has the resistance associated with memory state $R_{RESET}$ and the lower PMC structure 474 has the resistance associated with memory state $R_{RESET}$ so that the overall resistance of the dual PMC structure for memory states B and C is $R_{RESET}+R_{RESET}$. Thus, the memory states B and C are difficult to distinguish, so the dual PMC structure of the resistance switching device 122c can be implemented as a three-state memory device having memory states A, B (or C), and D.

Figure 21:
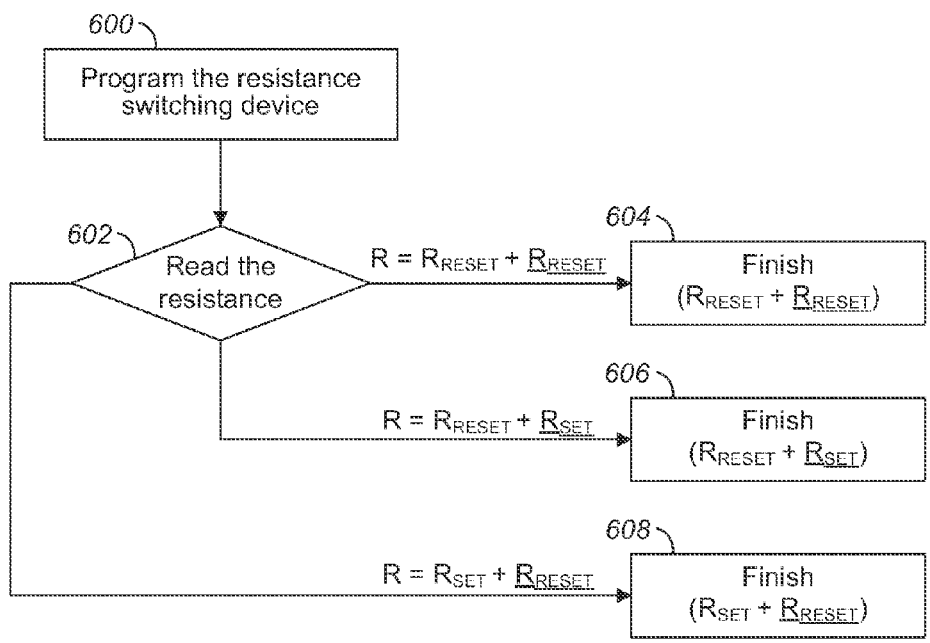
FIG. 21 shows a flowchart of a reading process for a resistance switching device shown according to FIG. 20.

FIG. 21 shows an alternative process for reading the resistance switching device 122c according to the asymmetrical embodiment having asymmetrical resistance switching characteristics as shown in FIGS. 18-20. First, at block 600, the resistance switching device 122c has been programmed to one of the memory states A, B/C, or D. The remainder of the process will allow for reading the resistance switching device 122c in order to determine which of the memory states A, B/C, or D was written to the resistance switching device 122c. At block 602, the resistance of the resistance switching device 122c is determined. As shown in FIG. 20, the resistance can be expected to be one of the resistance values associated with memory states A ($R_{SET}+R_{RESET}$), B/C ($R_{RESET}+R_{RESET}$), or D ($R_{SET}+R_{RESET}$). If the resistance value $R_{RESET}+R_{RESET}$ is detected, the process ends at block 604 with a determination that the memory state of the resistance switching device 122c is memory state B/C. If the resistance value $R_{SET}+R_{RESET}$ is detected, the process ends at block 606 with a determination that the memory state of the resistance switching device 122c is memory state D. If the resistance value $R_{SET}+R_{RESET}$ is detected, the process ends at block 608 with a determination that the memory state of the resistance switching device 122c is memory state A.

Figure 22:
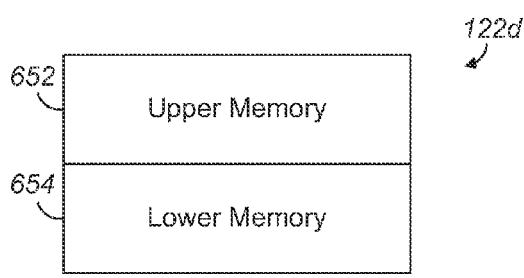
FIG. 22 shows a schematic view of a resistance switching device according to some embodiments of the resistance switching device shown in FIG. 2.

In addition to the foregoing embodiments 122a, 122b, and 122c of the resistance switching device 122 shown in FIGS. 1 and 2, it will be appreciated that there are many still further embodiments that are possible for the resistance switching device 122. FIG. 22 shows a block diagram of a more generalized embodiment, generally referred to as resistance switching device 122d. The resistance switching device 122d includes an upper memory structure 652 and a lower memory structure 654, where each of the memory structures 652 and 654 include a respective semiconductor resistance-switching memory device. For example, the upper memory structure 652 can include a PMC, a Resistive Random Access Memory (RRAM), a Magnetoresistive Random Access Memory (MRAM), or a Ferroelectric Random Access Memory (FRAM). Similarly, the lower memory structure 654 can include a PMC, an RRAM, an MRAM, or an FRAM. Alternatively, the upper and lower memory structures 652 and 654 can include any electronic memory device capable of switching between two resistance values (corresponding to two memory states).

The memory states of the upper memory structure 652 include memory states designated $R_{RESET}$ and $R_{SET}$, which correspond to relatively higher and lower resistance values, respectively. A positive reset voltage ($+V_{RESET}$) can switch the resistance of the upper memory structure 652 to the resistance $R_{RESET}$, and a negative set voltage ($-V_{SET}$) can switch the resistance of the upper memory structure 652 to the resistance $R_{SET}$. The memory states of the lower memory structure 654 include memory states designated $R_{RESET}$ and $R_{SET}$, which correspond to relatively higher and lower resistance values, respectively. A negative reset voltage ($-V_{RESET}$) can switch the resistance of the upper memory structure 652 to the resistance $R_{RESET}$, and a positive set voltage ($+V_{SET}$) can switch the resistance of the upper memory structure 652 to the resistance $R_{SET}$. There are two desirable condition sets for the resistance switching device 122*d*. The first condition set satisfies both the following conditions (1a) and (1b):

$$+V_{RESET} > +V_{SET} \quad (1a)$$

$$|-V_{SET}| > |-V_{RESET}| \quad (1b)$$

The second condition set satisfies both the following conditions (2a) and (2b):

$$+V_{RESET} < +V_{SET} \quad (2a)$$

$$|-V_{SET}| < |-V_{RESET}| \quad (2b)$$

Embodiments of the resistance switching device 122*d* that satisfy the first condition set are described with reference to FIGS. 23-26. Embodiments of the resistance switching device 122*d* that satisfy the second condition set are described with reference to FIGS. 27-30.

Figure 23:
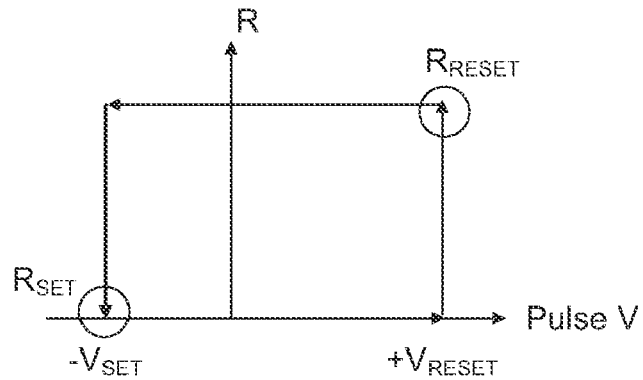
FIG. 23 shows the resistance switching characteristics of the upper memory structure of an embodiment of the resistance switching device shown in FIG. 22.
Figure 24:
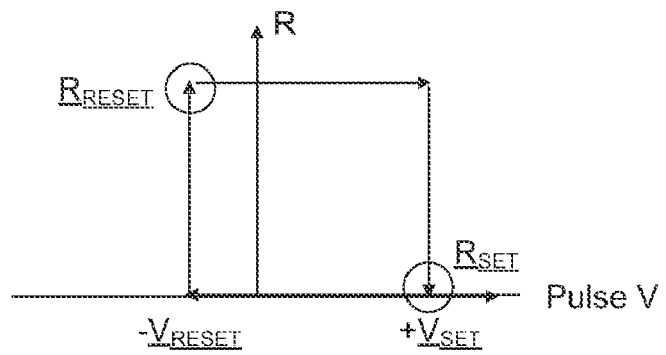
FIG. 24 shows the resistance switching characteristics of the lower memory structure of an embodiment of the resistance switching device shown in FIG. 22.
Figure 25:
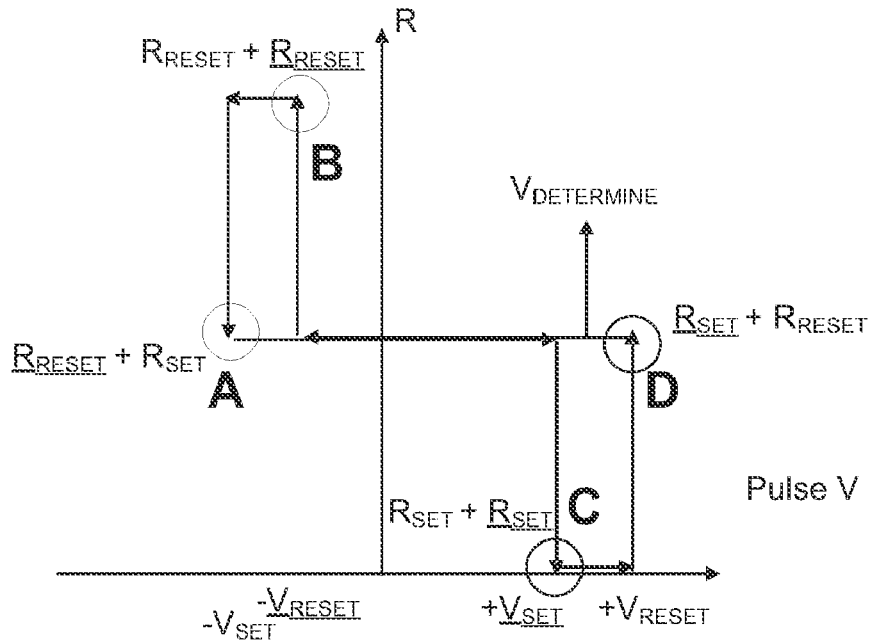
FIG. 25 shows the resistance switching characteristics of a resistance switching device that includes upper and lower memory structures having the resistance switching characteristics shown in FIGS. 23 and 24, respectively.

FIGS. 23-25 show diagrams of the resistance switching characteristics of an embodiment of the resistance switching device 122*d* satisfying the first set of conditions (1a) and (1b). More specifically, FIG. 23 shows the resistance switching characteristics of the upper memory structure 652, FIG. 24 shows the resistance switching characteristics of the lower memory structure 654, and FIG. 25 shows the overall resistance switching characteristics of the resistance switching device 122*d* according to the present embodiment.

As shown in FIG. 23, a positive voltage $+V_{RESET}$ across the upper memory structure 652 will cause the resistance of the upper memory structure 652 to switch to the resistance value associated with memory state $R_{RESET}$. A negative voltage $-V_{SET}$ across the upper memory structure 652 will cause the resistance of the upper memory structure 652 to switch to the resistance value associated with memory state $R_{SET}$.

As shown in FIG. 24, a positive voltage $+V_{SET}$ across the lower memory structure 654 will cause the resistance of the lower memory structure 654 to switch to the resistance value associated with memory state $R_{SET}$. A negative voltage $-V_{RESET}$ across the lower memory structure 654 will cause the resistance of the lower memory structure 654 to switch to the resistance value associated with memory state $R_{RESET}$.

The combination of the upper and lower memory structures 652 and 654 as shown in FIGS. 23 and 24 results in a memory device capable of four memory states A-D as shown in FIG. 25. Each of the memory states A-D is associated with a respective sum of resistances of the memory states of the upper and lower memory structures 652 and 654. The memory state A occurs when the resistance of the upper memory structure 652 has the resistance associated with memory state $R_{SET}$ and the lower memory structure 654 has the resistance associated with memory state $R_{RESET}$ so that the overall resistance of the resistance switching device 122*d* for memory state A is $R_{SET} + R_{RESET}$. The memory state B occurs when the resistance of the upper memory structure 652 has the resistance associated with memory state $R_{RESET}$ and the lower memory structure 654 has the resistance associated with memory state $R_{RESET}$ so that the overall resistance of the resistance switching device 122*d* for memory state B is $R_{RESET} + R_{RESET}$. The memory state C occurs when the resistance of the upper memory structure 652 has the resistance associated with memory state $R_{SET}$ and the lower memory structure 654 has the resistance associated with memory state $R_{SET}$ so that the overall resistance of the resistance switching device 122*d* for memory state C is $R_{SET} + R_{SET}$. The memory state D occurs when the resistance of the upper memory structure 652 has the resistance associated with memory state $R_{RESET}$ and the lower memory structure 654 has the resistance associated with memory state $R_{SET}$ so that the overall resistance of the resistance switching device 122*d* for memory state D is $R_{SET} + R_{RESET}$. Thus, the resistance switching device 122*d* can be implemented as a four-state memory device having memory states A, B, C, and D.

Figure 26:
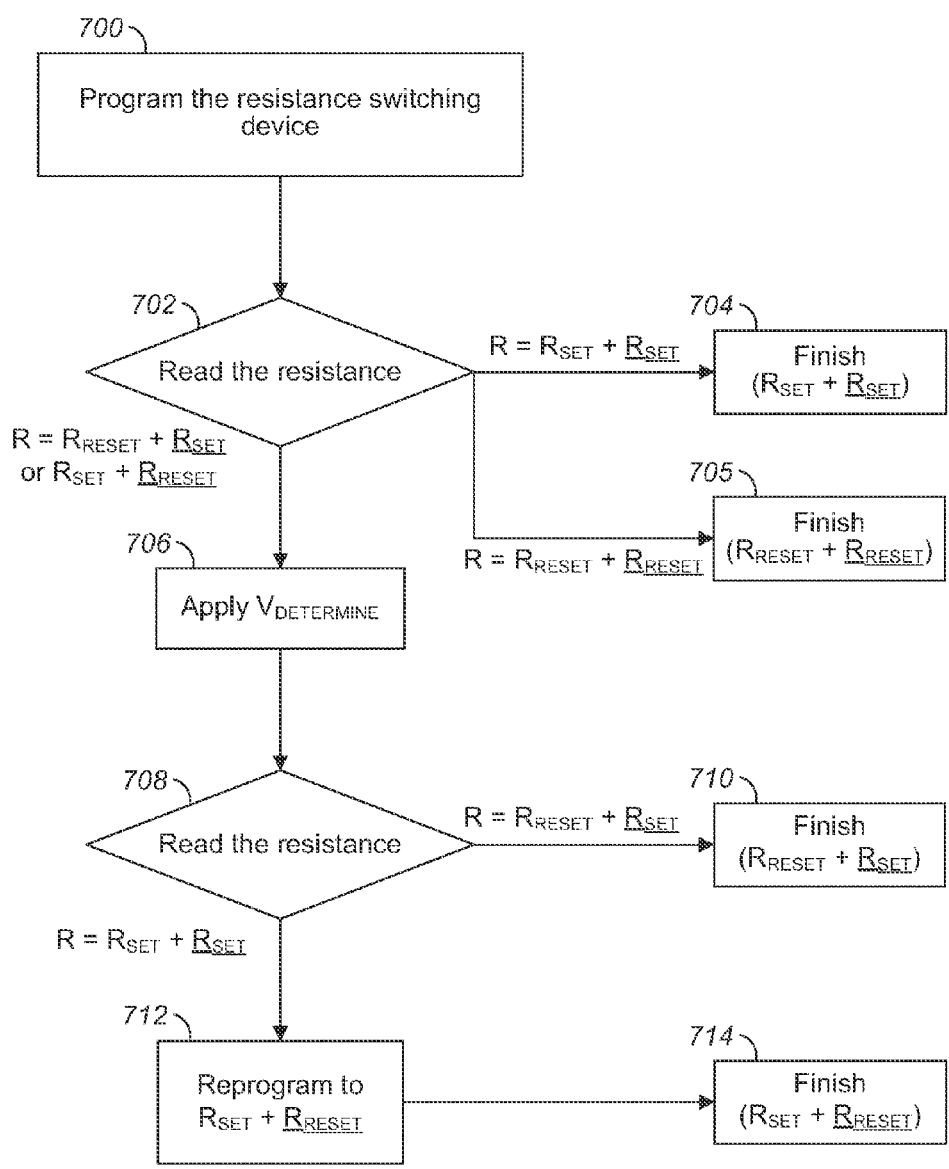
FIG. 26 shows a flowchart of a reading process for a resistance switching device shown according to FIG. 25.

A process for reading the resistance switching device 122*d* according to an embodiment as a four-state memory device satisfying the first set of conditions (1a) and (1b) is next described with reference to FIG. 26, which shows a flowchart of the reading process.

First, at block 700, the resistance switching device 122*d* has been programmed to one of the memory states A, B, C, or D. The remainder of the process will allow for reading the resistance switching device 122*d* in order to determine which of the memory states A-D was written to the resistance switching device 122*d*. At block 702, the resistance of the resistance switching device 122*d* is determined. The resistance of the resistance switching device 122*d* can be expected to one of the four resistance values associated with the memory states A-D, respectively. If the resistance value $R = R_{SET} + R_{SET}$ is detected, the process ends at block 704 with a determination that the memory state of the resistance switching device 122*d* is memory state C ($R_{SET} + R_{SET}$). If the resistance value $R = R_{RESET} + R_{RESET}$ is detected, the process ends at block 705 with a determination that the memory state of the resistance switching device 122*d* is memory state B ($R_{RESET} + R_{RESET}$). In the present embodiment, the resistance associated with $R_{SET}$ is substantially equal to the resistance associated with $R_{SET}$, and the resistance associated with $R_{RESET}$ is substantially equal to the resistance associated with $R_{RESET}$. Thus, a third possibility at block 702 is that the resistance is $R = R_{RESET} + R_{SET} = R_{SET} + R_{RESET}$. If this third possibility occurs, then the process continues in order to distinguish between the memory states A ($R_{SET} + R_{RESET}$) and D ($R_{RESET} + R_{SET}$).

Next, at block 706 a voltage $V_{DETERMINE}$ is applied across the resistance switching device 122*d*, and then at block 708 the resistance of the resistance switching device 122*d* is measured. In this embodiment, a voltage for $V_{DETERMINE}$ is selected that will cause the lower memory structure 654 to switch from $R_{RESET}$ to $R_{SET}$ if the memory state is memory state A, but will not result in any change if the memory state is memory state D. Thus, the voltage of $V_{DETERMINE}$ is a voltage between $+V_{SET}$ and $+V_{RESET}$.

At block 708, the resistance of the resistance switching device 122*d* is again determined. If the detected resistance at block 708 is $R = R_{RESET} + R_{SET}$, it can be determined that the memory state is memory state D since the resistance value was not changed by the application of $V_{DETERMINE}$. Thus, the process ends at block 710 with a determination that the memory state of the resistance switching device 122*d* is the memory state D. Otherwise, if the detected resistance at block 708 is $R = R_{RESET} + R_{SET}$, it can be determined that the memory state is memory state A since the resistance value was changed by the application of $V_{DETERMINE}$. Note that in this case, the application of $V_{DETERMINE}$ switched the resistance value of the lower memory structure 654 from $R_{RESET}$ to $R_{SET}$. Thus, the process continues with block 712, where the resistance of the lower memory structure 654 is switched back to $R_{RESET}$ (e.g., by application of $-V_{RESET}$) so that the memory state of the resistance memory device 122*d* is not disturbed by the present read process. Then the process ends at block 714 with a determination that the memory state of the resistance switching device 122d is the memory state A.

Figure 27:
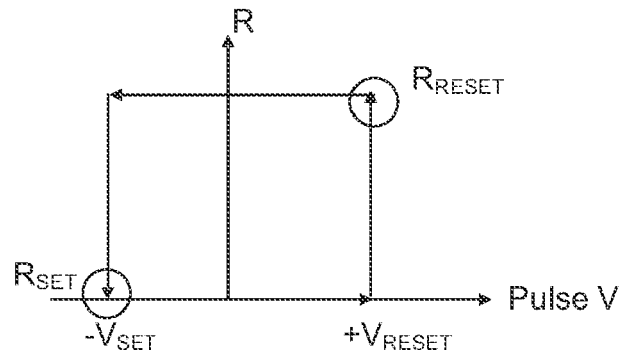
FIG. 27 shows the resistance switching characteristics of the upper memory structure of an embodiment of the resistance switching device shown in FIG. 22.
Figure 28:
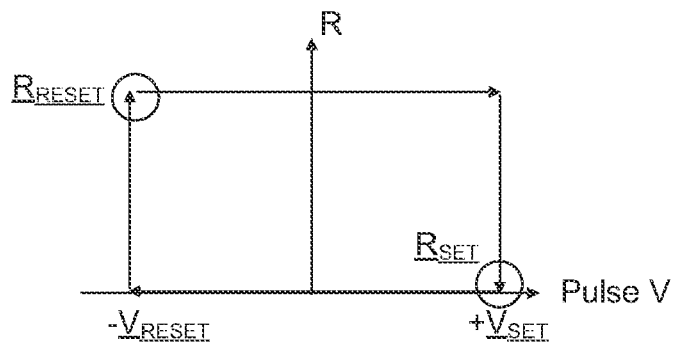
FIG. 28 shows the resistance switching characteristics of the lower memory structure of an embodiment of the resistance switching device shown in FIG. 22.
Figure 29:
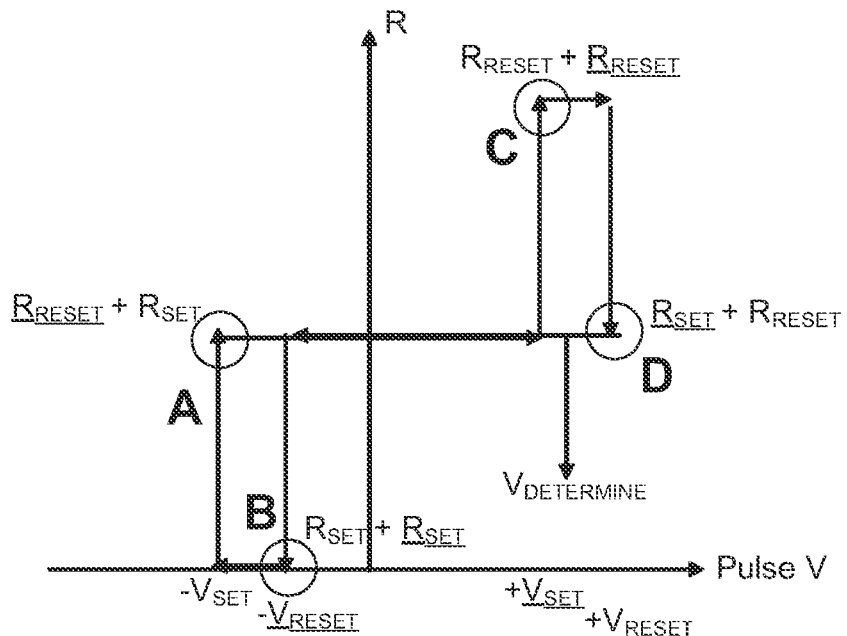
FIG. 29 shows the resistance switching characteristics of a resistance switching device that includes upper and lower memory structures having the resistance switching characteristics shown in FIGS. 27 and 28, respectively.

FIGS. 27-29 show diagrams of the resistance switching characteristics of an embodiment of the resistance switching device 122d satisfying the second set of conditions (2a) and (2b). More specifically, FIG. 27 shows the resistance switching characteristics of the upper memory structure 652, FIG. 28 shows the resistance switching characteristics of the lower memory structure 654, and FIG. 29 shows the overall resistance switching characteristics of the resistance switching device 122d according to the present embodiment.

As shown in FIG. 27, a positive voltage $+V_{\overline{RESET}}$ across the upper memory structure 652 will cause the resistance of the upper memory structure 652 to switch to the resistance value associated with memory state $R_{\overline{RESET}}$. A negative voltage $-V_{\overline{SET}}$ across the upper memory structure 652 will cause the resistance of the upper memory structure 652 to switch to the resistance value associated with memory state $R_{\overline{SET}}$.

As shown in FIG. 28, a positive voltage $+V_{SET}$ across the lower memory structure 654 will cause the resistance of the lower memory structure 654 to switch to the resistance value associated with memory state $R_{SET}$. A negative voltage $-V_{RESET}$ across the lower memory structure 654 will cause the resistance of the lower memory structure 654 to switch to the resistance value associated with memory state $R_{RESET}$.

The combination of the upper and lower memory structures 652 and 654 as shown in FIGS. 27 and 28 results in a memory device capable of four memory states A-D as shown in FIG. 29. Each of the memory states A-D is associated with a respective sum of resistances of the memory states of the upper and lower memory structures 652 and 654. The memory state A occurs when the resistance of the upper memory structure 652 has the resistance associated with memory state $R_{\overline{SET}}$ and the lower memory structure 654 has the resistance associated with memory state $R_{RESET}$ so that the overall resistance of the resistance switching device 122d for memory state A is $R_{\overline{SET}}+R_{RESET}$. The memory state B occurs when the resistance of the upper memory structure 652 has the resistance associated with memory state $R_{\overline{SET}}$ and the lower memory structure 654 has the resistance associated with memory state $R_{SET}$ so that the overall resistance of the resistance switching device 122d for memory state B is $R_{\overline{SET}}+R_{SET}$. The memory state C occurs when the resistance of the upper memory structure 652 has the resistance associated with memory state $R_{\overline{RESET}}$ and the lower memory structure 654 has the resistance associated with memory state $R_{RESET}$ so that the overall resistance of the resistance switching device 122d for memory state C is $R_{\overline{RESET}}+R_{RESET}$. The memory state D occurs when the resistance of the upper memory structure 652 has the resistance associated with memory state $R_{\overline{RESET}}$ and the lower memory structure 654 has the resistance associated with memory state $R_{SET}$ so that the overall resistance of the resistance switching device 122d for memory state D is $R_{SET}+R_{\overline{RESET}}$. Thus, the resistance switching device 122d can be implemented as a four-state memory device having memory states A, B, C, and D.

Figure 30:
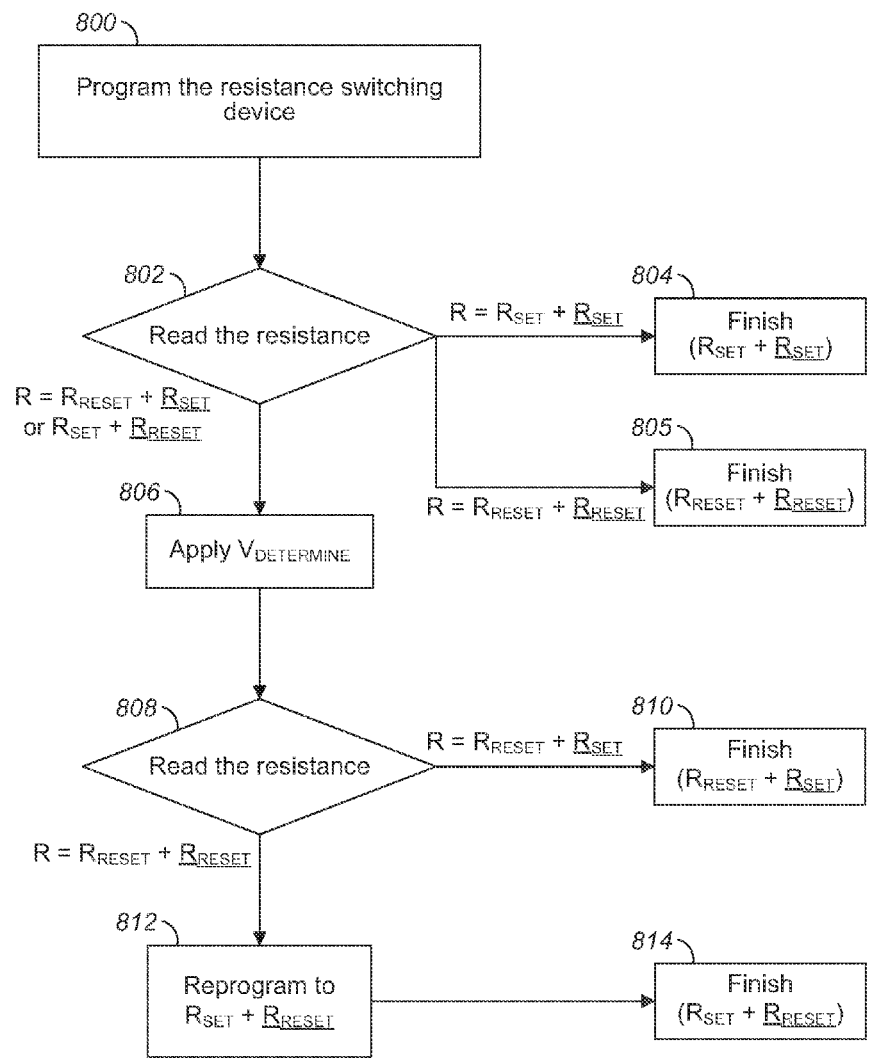
FIG. 30 shows a flowchart of a reading process for a resistance switching device shown according to FIG. 29.

A process for reading the resistance switching device 122d according to an embodiment as a four-state memory device satisfying the second set of conditions (2a) and (2b) is next described with reference to FIG. 30, which shows a flowchart of the reading process.

First, at block 800, the resistance switching device 122d has been programmed to one of the memory states A, B, C, or D. The remainder of the process will allow for reading the resistance switching device 122d in order to determine which of the memory states A-D was written to the resistance switching device 122d.

At block 802, the resistance of the resistance switching device 122d is determined. The resistance of the resistance switching device 122d can be expected to one of the four resistance values associated with the memory states A-D, respectively. If the resistance value $R=R_{\overline{SET}}+R_{SET}$ is detected, the process ends at block 804 with a determination that the memory state of the resistance switching device 122d is memory state B ($R_{\overline{SET}}+R_{SET}$). If the resistance value $R=R_{\overline{RESET}}+R_{RESET}$ is detected, the process ends at block 805 with a determination that the memory state of the resistance switching device 122d is memory state C ($R_{\overline{RESET}}+R_{RESET}$).

In the present embodiment, the resistance associated with $R_{SET}$ is substantially equal to the resistance associated with $R_{\overline{SET}}$, and the resistance associated with $R_{RESET}$ is substantially equal to the resistance associated with $R_{\overline{RESET}}$. Thus, a third possibility at block 802 is that the resistance is $R=R_{\overline{RESET}}+R_{SET}=R_{\overline{SET}}+R_{RESET}$. If this third possibility occurs, then the process continues in order to distinguish between the memory states A ($R_{\overline{SET}}+R_{RESET}$) and D ($R_{\overline{RESET}}+R_{SET}$).

Next, at block 806 a voltage $V_{DETERMINE}$ is applied across the resistance switching device 122d, and then at block 808 the resistance of the resistance switching device 122d is measured. In this embodiment, a voltage for $V_{DETERMINE}$ is selected that will cause the upper memory structure 652 to switch from $R_{\overline{SET}}$ to $R_{\overline{RESET}}$ if the memory state is memory state A, but will not result in any change if the memory state is memory state D. Thus, the voltage of $V_{DETERMINE}$ is a voltage between $+V_{\overline{RESET}}$ and $+V_{SET}$.

At block 808, the resistance of the resistance switching device 122d is again determined. If the detected resistance at block 808 is $R=R_{\overline{RESET}}+R_{SET}$, it can be determined that the memory state is memory state D since the resistance value was not changed by the application of $V_{DETERMINE}$. Thus, the process ends at block 810 with a determination that the memory state of the resistance switching device 122d is the memory state D. Otherwise, if the detected resistance at block 808 is $R=R_{\overline{RESET}}+R_{RESET}$, it can be determined that the memory state is memory state A since the resistance value was changed by the application of $V_{DETERMINE}$. Note that in this case, the application of $V_{DETERMINE}$ switched the resistance value of the upper memory structure 652 from $R_{\overline{SET}}$ to $R_{\overline{RESET}}$. Thus, the process continues with block 812, where the resistance of the upper memory structure 652 is switched back to $R_{\overline{SET}}$ (e.g., by application of $-V_{\overline{SET}}$) so that the memory state of the resistance memory device 122d is not disturbed by the present read process. Then the process ends at block 814 with a determination that the memory state of the resistance switching device 122d is the memory state A.

Figure 31:
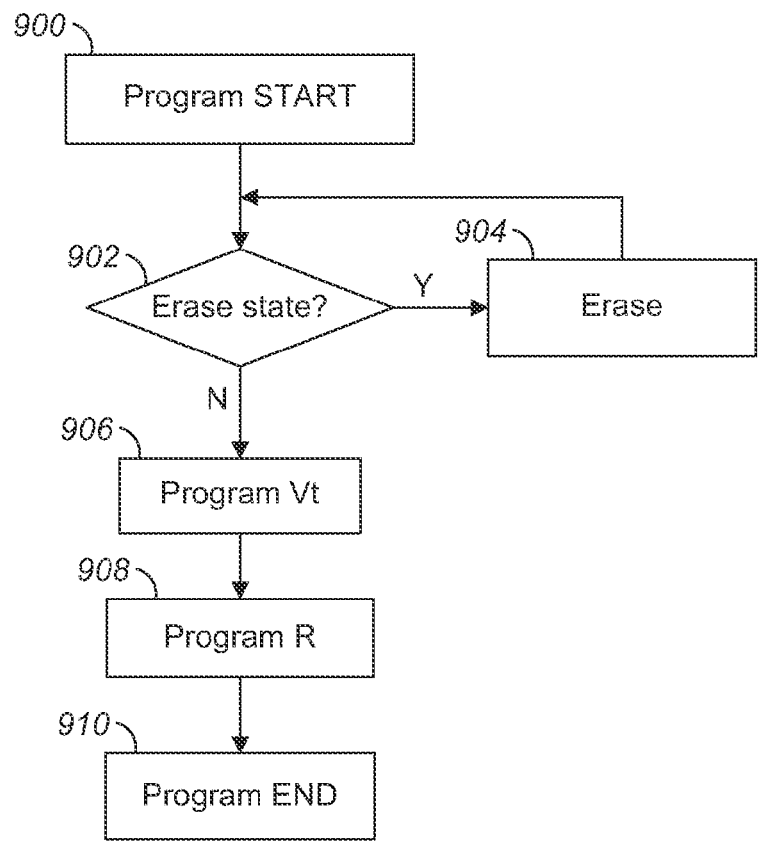
FIG. 31 shows a flowchart of a programming process for the memory cell shown in FIG. 2.

FIG. 31 shows a flowchart of a process for programming the memory cell 112. The program procedure begins at block 900, for example including the use of a Write Enable signal. At block 902, a determination is made as to whether the current write is for erasing the memory cell. If so, the process continues with block 904 where data stored in the transistor 120 is erased. For example, where the transistor 120 is a floating gate transistor, the transistor 120 is erased through FN tunneling. In one such embodiment, for example, the transistor 120 can be configured to have an ERASE gate voltage Vg in a range of −7 volts to −8 volts, so that during application of the ERASE gate voltage Vg an RHS bit can be erased by applying a drain voltage of 4.5 volts and source voltage of 0 volts; and a LHS bit can be erased by applying a drain voltage of 0 volts and a source voltage of 4.5 volts.

At block 906, the transistor 120 is programmed and at block 908 the resistance switching device 122 is programmed. The program operation is then terminated at block 910.

The transistor 120 and the resistance switching device 122 are configured such that the program voltages for the transistor 120 do not interfere with the memory state(s) of the resistance switching device 122, and vice-versa. Also, the gate voltage Vg for activating the transistor 120 while programming the resistance switching device 122 is selected to be less than the gate voltage for programming the transistor 120 but greater than the threshold voltage of the transistor 120. This allows the transistor 120 to be activated to allow for programming the resistance switching device 122 without affecting the programming state of the transistor 120.

One specific non-limiting example includes a transistor 120 having a PROGRAM gate voltage in a range of 7 volts to 12 volts (500 ns) capable of storing first and second bits (RHS bit and LHS bit). The RHS bit can be programmed using Vd=3.5 volts and Vs=Vb=0 volts; the LHS bit can be programmed using Vd=Vb=0 volts and Vs=3.5 volts. In this example, the ERASE gate voltage is in a range of −7 volts and −8 volts. The RHS bit can be erased using Vd=4.5 volts and Vs=Vb=0 volts; the LHS bit can be erased using Vd=Vb=0 volts and Vs=4.5 volts. The resistance switching device 122 includes an RRAM where the SET voltage is +/−2 volts, and the RESET voltage is +/−3 volts. The voltage is applied to the resistance switching device 122 while the gate voltage to the transistor 120 is set less than the PROGRAM gate voltage, but greater than the Vt of the transistor 120. This is merely one example provided for purposes of clarity. Numerous other implementations are possible.

Figure 32:
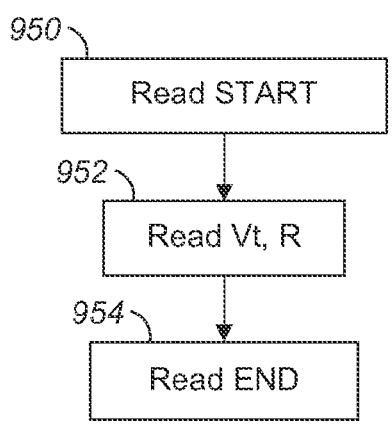
FIG. 32 shows a flowchart of a reading process for the memory cell shown in FIG. 2.

FIG. 32 shows a flowchart of a process for reading the memory cell 112. The read procedure begins at block 900, for example including the use of a Read Enable signal. At block 952 the data from the transistor 120 and resistance switching device is read, and then the process is terminated at block 954. The read operation at block 952 can vary depending on the type of transistor and type of resistance switching device used. For example, the read operation can include processes described herein for various embodiments of the resistance switching device 122. The gate voltage Vg will be set to a predetermined READ gate voltage, then the drain and source voltages Vd and Vs are set. The resistance through the resistance switching device 122 is also measured.

In the specific example presented above, the RHS bit can be read by application of Vd=1.6 volts and Vs=Vb=0 volts (and the resistance R of the resistance switching device 122 is also measured); the LHS bit can be read by application of Vd=Vb=0 volts and Vs=1.6 volts (and the resistance R of the resistance switching device 122 is also measured).

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A memory device comprising an array of memory cells, at least one of the memory cells comprising:
    a transistor having a first terminal, a second terminal, and a gate terminal, the transistor being configured to be switchable between a plurality of different threshold voltages associated with respective memory states; and
    a resistance switching device connected in series with one of the first and second terminals of the transistor, the resistance switching device being configured to be switchable between a plurality of different resistances associated with respective memory states, wherein the resistance switching device comprises a first memory layer, a second memory layer, and a medium layer formed between the first memory layer and the second memory layer.

2. The memory device of claim 1, wherein the resistance switching device includes first and second interface regions having respective different resistance switching characteristics.

3. The memory device of claim 2, wherein at least one of the first and second interface region includes at least a portion of the medium layer.

4. The memory device of claim 3, wherein the medium layer comprises tungsten oxide.

5. The memory device of claim 2, wherein the resistance switching characteristics of the first interface region are symmetrical to the resistance switching characteristics of the second interface region.

6. The memory device of claim 2, wherein the resistance switching characteristics of the first interface region are asymmetrical to the resistance switching characteristics of the second interface region.

7. The memory device of claim 1, wherein the resistance switching device includes a first programmable metallization cell.

8. The memory device of claim 7, wherein the resistance switching device includes a second programmable metallization cell.

9. The memory device of claim 8, wherein the first programmable metallization cell includes the first memory layer as a first solid electrolyte layer and the second programmable metallization cell includes the second memory layer as a second solid electrolyte layer.

10. The memory device of claim 9, wherein the medium layer of the resistance switching device includes an oxidizable electrode layer disposed between the first and second solid electrolyte layers.

11. The memory device of claim 8, wherein the first programmable metallization cell and the second programmable metallization cell have respective different resistance switching characteristics.

12. The memory device of claim 11, wherein the resistance switching characteristics of the first programmable metallization cell are symmetrical to the resistance switching characteristics of the second programmable metallization cell.

13. The memory device of claim 11, wherein the resistance switching characteristics of the first programmable metallization cell are asymmetrical to the resistance switching characteristics of the second programmable metallization cell.

14. The memory device of claim 1, wherein the resistance switching device includes first and second memory structures.

15. The memory device of claim 14, wherein the first memory structure includes one of an RRAM, an MRAM, and an FRAM.

16. The memory device of claim 1, wherein the transistor includes a floating gate.

17. A memory device comprising:
    a first control line;
    a second control line;

a memory cell in communication with the first and second control lines, the memory cell comprising:
- a transistor having a first terminal, a second terminal, and a gate terminal, the transistor being configured to be switchable between a plurality of different threshold voltages associated with respective memory states; and
- a resistance switching device connected in series between the first control line and the first terminal of the transistor, the resistance switching device being configured to be switchable between a plurality of different resistances associated with respective memory states, wherein the resistance switching device comprises a first memory layer, a second memory layer, and a medium layer formed between the first memory layer and the second memory layer.

18. A memory device according to claim 17, wherein the gate terminal is connected to the second control line.

19. A memory device according to claim 17, wherein the first and second control lines can be controlled for storing data to the transistor and for storing data to the resistance switching device.

20. A memory device according to claim 17, wherein the first and second control lines can be controlled for reading data from the transistor and for reading data from the resistance switching device.

21. The memory device of claim 17, wherein the resistance switching device includes first and second interface regions having respective different resistance switching characteristics.

22. The memory device of claim 21, wherein at least one of the first and second interface region includes at least a portion of the medium layer.

23. The memory device of claim 22, wherein the medium layer comprises tungsten oxide.

24. The memory device of claim 17, wherein the resistance switching device includes a first programmable metallization cell.

25. The memory device of claim 24, wherein the resistance switching device includes a second programmable metallization cell.

26. The memory device of claim 25, wherein the first programmable metallization cell includes the first memory layer as a first solid electrolyte layer and the second programmable metallization cell includes the second memory layer as a second solid electrolyte layer.

27. The memory device of claim 26, wherein the medium layer of the resistance switching device includes an oxidizable electrode layer disposed between the first and second solid electrolyte layers.

28. The memory device of claim 17, wherein the resistance switching device includes first and second memory structures.

29. The memory device of claim 28, wherein the first memory structure includes one of an RRAM, an MRAM, and an FRAM.

30. The memory device of claim 17, wherein the transistor includes a floating gate.

31. A method of reading a memory cell of a semiconductor memory device, the method comprising:
- detecting a threshold voltage of a transistor of the memory cell, the transistor being configured to be switchable between a plurality of threshold voltages associated with respective memory states; and
- detecting a resistance of a resistance switching device of the memory cell, the resistance switching device being connected in series with the transistor and being configured to be switchable between a plurality of resistances associated with respective memory states, wherein the resistance switching device comprises a first memory layer, a second memory layer, and a medium layer formed between the first memory layer and the second memory layer.

32. The method of claim 31, wherein the detecting of the threshold voltage of the transistor includes applying a first voltage to a gate terminal of the transistor and applying a second voltage across the memory cell such that current flows through the resistance memory device if the first voltage exceeds a presently programmed threshold voltage of the transistor.

33. The method of claim 31, wherein the detecting of the resistance of the resistance switching device includes allowing a current to flow through the transistor.

* * * * *